(12) United States Patent
    Sakurai et al.

(10) Patent No.: US 11,028,487 B2
(45) Date of Patent: Jun. 8, 2021

(54) HARD COATING AND MEMBER COATED WITH HARD COATING

(71) Applicant: OSG CORPORATION, Toyokawa (JP)

(72) Inventors: Masatoshi Sakurai, Toyokawa (JP); Mei Wang, Toyokawa (JP)

(73) Assignee: OSG CORPORATION, Toyokawa (JP)

( * ) Notice: Subject to any disclaimer, the term of this patent is extended or adjusted under 35 U.S.C. 154(b) by 53 days.

(21) Appl. No.: 16/344,826

(22) PCT Filed: Oct. 25, 2016

(86) PCT No.: PCT/JP2016/081647
§ 371 (c)(1),
(2) Date: Apr. 25, 2019

(87) PCT Pub. No.: WO2018/078731
PCT Pub. Date: May 3, 2018

(65) Prior Publication Data
US 2019/0249311 A1    Aug. 15, 2019

(51) Int. Cl.
*C23C 16/06* (2006.01)
*C23C 30/00* (2006.01)
(Continued)

(52) U.S. Cl.
CPC .......... *C23C 30/005* (2013.01); *B32B 15/01* (2013.01); *C23C 14/06* (2013.01); *C23C 14/0641* (2013.01); *C23C 28/027* (2013.01)

(58) Field of Classification Search
CPC .... C23C 14/06; C23C 14/0641; C23C 30/005
(Continued)

(56) References Cited

U.S. PATENT DOCUMENTS 5,700,551 A     12/1997  Kukino et al.
2006/0269788 A1* 11/2006 Ishikawa ............. C23C 14/0623
                                                  428/698
(Continued)

FOREIGN PATENT DOCUMENTS

CN    103168113 A    6/2013
JP    H08-134629 A   5/1996
(Continued)

OTHER PUBLICATIONS

Nov. 29, 2016 International Search Report issued in International Patent Application No. PCT/JP2016/081647.
(Continued)

*Primary Examiner* — Archene A Turner
(74) *Attorney, Agent, or Firm* — Oliff PLC

(57) ABSTRACT

A hard film for coating a surface of a base material, the hard film includes a layer A, a layer B, and a nanolayer-alternating layer. The layer A is an AlTiCr nitride of $(Al_a Ti_b Cr_c \alpha_d)N$, where $\alpha$ is one or more elements selected from C, B, Si, V, Y, Zr, Nb, Mo, Hf, Ta, and W. The layer B is an AlTiCr nitride or AlTiCr carbonitride of $(Al_e Ti_f Cr_g \beta_h)C_x N_{1-x}$, where $\beta$ is one or more elements selected from B, Si, V, Y, Zr, Nb, Mo, Hf, Ta, and W. The nanolayer-alternating layer is formed by alternately laminating a nanolayer A or a nanolayer B having the same composition as the layer A or B. And, the layer C is an AlCr(SiC) nitride or AlCr(SiC) carbonitride of $[Al_i Cr_j (SiC)_k \gamma_l]C_y N_{1-y}$, where $\gamma$ is one or more elements selected from B, Ti, V, Y, Zr, Nb, Mo, Hf, Ta, and W.

6 Claims, 11 Drawing Sheets

(51) Int. Cl.
*C23C 28/02* (2006.01)
*C23C 14/06* (2006.01)
*B32B 15/01* (2006.01)

(58) Field of Classification Search
USPC .................. 428/216, 336, 697, 698, 699
See application file for complete search history.

(56) References Cited

U.S. PATENT DOCUMENTS

| | | |
|---|---|---|
| 2009/0155559 A1* | 6/2009 | Xu .................. C23C 28/042 |
| | | 428/216 |
| 2009/0317659 A1 | 12/2009 | Yamamoto |
| 2010/0215951 A1 | 8/2010 | Shibata et al. |
| 2011/0171444 A1 | 7/2011 | Elkouby et al. |
| 2012/0213990 A1* | 8/2012 | Sugita ................ C23C 14/0688 |
| | | 428/336 |
| 2014/0147683 A1 | 5/2014 | Arndt |
| 2016/0265098 A1 | 9/2016 | Tsukihara et al. |
| 2017/0029931 A1 | 2/2017 | Hirano et al. |
| 2017/0037502 A1 | 2/2017 | Wang et al. |
| 2017/0216928 A1 | 8/2017 | Metoki |
| 2018/0071829 A1 | 3/2018 | Hirano |

FOREIGN PATENT DOCUMENTS

| | | |
|---|---|---|
| JP | 2010-001547 A | 1/2010 |
| JP | 2011-189473 A | 9/2011 |
| JP | 2012-035377 A | 2/2012 |
| JP | 2012-097303 A | 5/2012 |
| JP | 2012-097304 A | 5/2012 |
| JP | 2013-516331 A | 5/2013 |
| JP | 2016-098434 A | 5/2016 |
| WO | 2008/146727 A1 | 12/2008 |
| WO | 2013/000557 A1 | 1/2013 |
| WO | 2015/064241 A1 | 5/2015 |
| WO | 2015/079505 A1 | 6/2015 |
| WO | 2015/147241 A1 | 10/2015 |
| WO | 2015/156383 A1 | 10/2015 |
| WO | 2016/013645 A1 | 1/2016 |

OTHER PUBLICATIONS

D. Durand-Drouhin et al. "Mechanical Properties and Failure Modes of TiAl(Si)N Single and Multilayer Thin Films". Surface and Coatings Technology, vols. 163-164, 2003, pp. 260-266.

Jun. 23, 2020 European Extended Search Report issued in European Patent Application No. 16920162.1.

Feb. 1, 2021 First Examination Report issued in Indian Patent Application No. 201917015973.

Mar. 1, 2021 Office Action issued in Chinese Patent Application No. 201680090364.0.

* cited by examiner

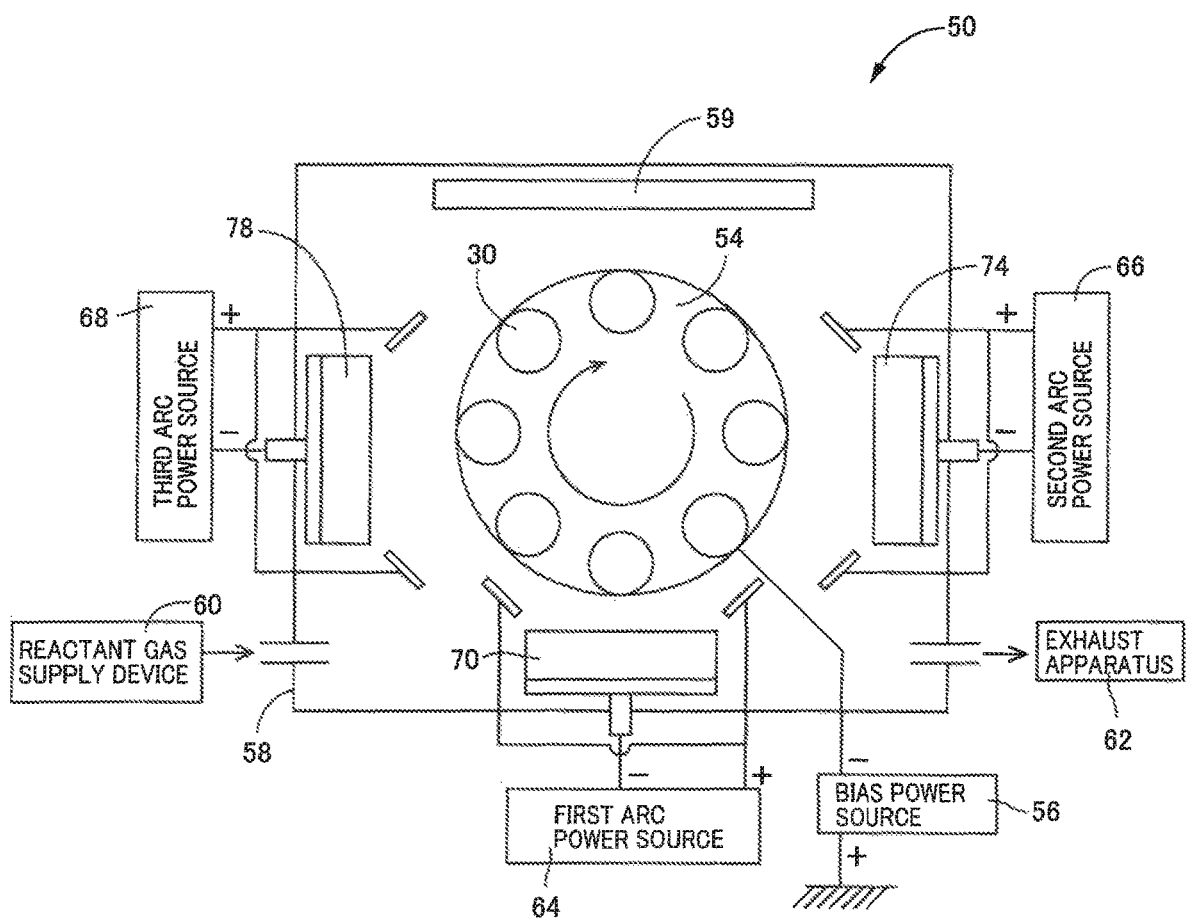

FIG.8

| COMPOSITION | LAYER A | | | | | | | | | | | | | |
|---|---|---|---|---|---|---|---|---|---|---|---|---|---|---|
| | Al | Ti | Cr | C | B | Si | V | Y | Zr | Nb | Mo | Hf | Ta | W |
| TEST PRODUCT 1 | 85.1 | 1.9 | 13.0 | | | | | | | | | | | |
| TEST PRODUCT 2 | 9.5 | 71.0 | 19.5 | | | | | | | | | | | |
| TEST PRODUCT 3 | 9.8 | 4.9 | 85.3 | | | | | | | | | | | |
| TEST PRODUCT 4 | 85.0 | 12.1 | 2.9 | | | | | | | | | | | |
| TEST PRODUCT 5 | 9.0 | 25.0 | 66.0 | | | | | | | | | | | |
| TEST PRODUCT 6 | 45.0 | 53.6 | 1.4 | | | | | | | | | | | |
| TEST PRODUCT 7 | 85.0 | 2.0 | 13.0 | | | | | | | | | | | |
| TEST PRODUCT 8 | 10.0 | 70.0 | 20.0 | | | | | | | | | | | |
| TEST PRODUCT 9 | 33.9 | 34.4 | 31.7 | | | | | | | | | | | |
| TEST PRODUCT 9 | 10.0 | 25.0 | 65.0 | | | | | | | | | | | |
| TEST PRODUCT 10 | 66.0 | 25.3 | 8.7 | | | | | | | | | | | |
| TEST PRODUCT 11 | 45.0 | 15.0 | 40.0 | | | | | | | | | | | |
| TEST PRODUCT 12 | 51.3 | 2.0 | 42.3 | | 4.4 | | | | | | | | | |
| TEST PRODUCT 13 | 60.2 | 24.5 | 13.1 | | | | 2.2 | | | | | | | |
| TEST PRODUCT 14 | 45.3 | 15.9 | 28.8 | | 5.5 | | 4.5 | | | | | | | |
| TEST PRODUCT 15 | 12.9 | 55.6 | 25.3 | | | | | | 6.2 | | | | | |
| TEST PRODUCT 16 | 75.1 | 10.2 | 14.7 | | | | | | | | | | | |
| TEST PRODUCT 17 | 34.9 | 35.4 | 29.7 | | | | | | | | | | | |
| TEST PRODUCT 18 | 65.5 | 23.4 | 11.1 | | | | | | | | | | | |
| TEST PRODUCT 19 | 55.1 | 23.3 | 21.6 | | | | | | | | | | | |
| TEST PRODUCT 20 | 22.1 | 50.3 | 23.5 | | | | | | | 4.1 | | | | |
| TEST PRODUCT 21 | 65.3 | 13.7 | 15.7 | | | | | | | | 5.3 | | | |
| TEST PRODUCT 22 | 10.5 | 32.5 | 50.0 | | | | 7.0 | | | | | | | |
| TEST PRODUCT 23 | 22.3 | 24.1 | 49.3 | | | | | | 4.3 | | | | | |
| TEST PRODUCT 24 | 71.1 | 10.4 | 13.4 | | | | 5.1 | | | | | | | |
| TEST PRODUCT 25 | 43.3 | 40.1 | 10.0 | | | | | | | | | | 6.6 | |
| TEST PRODUCT 26 | 12.9 | 70.0 | 9.1 | | | | | | 8.0 | | | | | |
| TEST PRODUCT 27 | 10.0 | 18.8 | 65.0 | 6.2 | | | | | | | | | | |
| TEST PRODUCT 28 | 47.9 | 25.9 | 26.2 | | | | | | | | | | | |
| TEST PRODUCT 29 | 65.8 | 20.6 | 13.6 | | | | | | | | | | | |
| TEST PRODUCT 30 | 56.5 | 12.2 | 31.3 | | | | | | | | | | | |
| TEST PRODUCT 31 | 44.1 | 22.3 | 33.6 | | | | | | | | | | | |
| TEST PRODUCT 32 | 65.0 | 20.0 | 15.0 | | | | | | | | | | | |
| TEST PRODUCT 33 | 52.0 | 45.0 | 3.0 | | | | | | | | | | | |
| TEST PRODUCT 34 | 33.3 | 45.1 | 21.6 | | | | | | | | | | | |
| TEST PRODUCT 35 | 25.7 | 12.5 | 61.8 | | | | | | | | | | | |
| TEST PRODUCT 36 | 77.2 | 10.5 | 12.3 | | | | | | | | | | | |
| TEST PRODUCT 37 | 10.0 | 45.0 | 45.0 | | | | | | | | | | | |
| TEST PRODUCT 38 | 85.0 | 6.0 | 5.0 | 4.0 | | | | | | | | | | |
| TEST PRODUCT 39 | 72.5 | 10.5 | 7.0 | 10.0 | | | | | | | | | | |
| TEST PRODUCT 40 | 68.2 | 25.9 | 4.9 | 1.0 | | | | | | | | | | |
| TEST PRODUCT 41 | 56.8 | 30.9 | 10.3 | | 2.0 | | | | | | | | | |
| TEST PRODUCT 42 | 35.0 | 45.0 | 15.7 | | 4.3 | | | | | | | | | |
| TEST PRODUCT 43 | 45.3 | 30.1 | 15.0 | 8.0 | 1.6 | | | | | | | | | |
| TEST PRODUCT 44 | 50.2 | 25.8 | 14.1 | 8.0 | 1.9 | | | | | | | | | |
| TEST PRODUCT 45 | 75.1 | 10.0 | 5.0 | | | 9.9 | | | | | | | | |
| TEST PRODUCT 46 | 37.8 | 44.3 | 7.9 | 5.0 | | 5.0 | | | | | | | | |
| TEST PRODUCT 47 | 10.0 | 70.0 | 18.6 | | | 1.4 | | | | | | | | |
| TEST PRODUCT 48 | 57.1 | 30.5 | 5.3 | 6.5 | | | 0.6 | | | | | | | |
| TEST PRODUCT 49 | 48.3 | 33.9 | 15.0 | | 1.8 | | 1.0 | | | | | | | |
| TEST PRODUCT 50 | 60.2 | 22.8 | 7.1 | | | | 9.9 | | | | | | | |
| TEST PRODUCT 51 | 65.4 | 20.1 | 5.3 | | | | | 9.2 | | | | | | |
| TEST PRODUCT 52 | 70.7 | 15.4 | 7.8 | 3.0 | | | | 3.1 | | | | | | |
| TEST PRODUCT 53 | 85.0 | 2.0 | 3.0 | | | | 1.0 | 9.0 | | | | | | |
| TEST PRODUCT 54 | 68.9 | 15.3 | 6.0 | | | | | | 9.8 | | | | | |
| TEST PRODUCT 55 | 60.1 | 22.9 | 15.9 | | | | | | 1.1 | | | | | |
| TEST PRODUCT 56 | 62.5 | 21.6 | 10.0 | | | | | | 5.9 | | | | | |
| TEST PRODUCT 57 | 33.9 | 12.9 | 45.0 | | | | 2.2 | | 6.0 | | | | | |
| TEST PRODUCT 58 | 48.7 | 41.3 | 5.0 | 3.6 | | | | | | 1.4 | | | | |
| TEST PRODUCT 59 | 85.0 | 5.1 | 5.3 | | 2.5 | | | | | 2.1 | | | | |
| TEST PRODUCT 60 | 77.3 | 12.3 | 6.7 | | | | 1.0 | | | 2.7 | | | | |
| TEST PRODUCT 61 | 48.9 | 45.0 | 3.1 | | | | | | | 3.0 | | | | |
| TEST PRODUCT 62 | 36.8 | 44.3 | 15.9 | | | | | | | 3.0 | | | | |
| TEST PRODUCT 63 | 25.2 | 44.9 | 22.1 | 4.2 | | | | | | 1.1 | 2.5 | | | |
| TEST PRODUCT 64 | 10.2 | 45.0 | 40.2 | | | | | | 2.3 | | 2.3 | | | |
| TEST PRODUCT 65 | 35.8 | 40.3 | 21.3 | | | | | | | 1.0 | 1.6 | | | |
| TEST PRODUCT 66 | 58.9 | 27.6 | 5.2 | | | | | | 5.5 | | 2.3 | 0.5 | | |
| TEST PRODUCT 67 | 65.3 | 25.0 | 3.0 | | 1.2 | | | | 2.5 | 2.5 | | 0.5 | | |
| TEST PRODUCT 68 | 65.3 | 25.9 | 5.9 | | | | | | | | | 2.9 | | |
| TEST PRODUCT 69 | 45.6 | 43.6 | 4.2 | | | | | | 1.5 | 1.9 | | | 3.2 | |
| TEST PRODUCT 70 | 30.2 | 45.0 | 15.3 | 5.0 | 1.0 | | | | | | | | 3.5 | |
| TEST PRODUCT 71 | 25.4 | 45.0 | 19.8 | 5.5 | | | | | | | | | 4.5 | |
| TEST PRODUCT 72 | 58.2 | 22.4 | 15.1 | 1.0 | | | | | | | | | | 3.3 |
| TEST PRODUCT 73 | 10.0 | 18.0 | 65.0 | | | | | | 3.0 | 1.4 | | | | 2.6 |
| TEST PRODUCT 74 | 65.2 | 18.2 | 10.5 | 1.0 | | 2.5 | 1.2 | | | | | | | 1.4 |

FIG.9

| COMPOSITION | Al | Ti | Cr | B | Si | Y | V | Zr | Nb | Mg | Hf | Ta | W | C | N |
|---|---|---|---|---|---|---|---|---|---|---|---|---|---|---|---|
| TEST PRODUCT 1 | 86.0 | 1.5 | 12.5 | | | | | | | | | | | 0.9 | 99.1 |
| TEST PRODUCT 2 | 9.5 | 25.3 | 65.2 | | | | | | | | | | | 61.3 | 38.7 |
| TEST PRODUCT 3 | 9.8 | 71.0 | 19.2 | | | | | | | | | | | 0.7 | 99.3 |
| TEST PRODUCT 4 | 85.3 | 1.9 | 12.8 | | | | | | | | | | | 1.0 | 99.0 |
| TEST PRODUCT 5 | 85.0 | 10.5 | 4.5 | | | | | | | | | | | 75.0 | 25.0 |
| TEST PRODUCT 6 | 9.8 | 71.2 | 19.0 | | | | | | | | | | | 60.3 | 39.7 |
| TEST PRODUCT 7 | 85.0 | 2.0 | 13.0 | | | | | | | | | | | – | 100.0 |
| TEST PRODUCT 8 | 85.0 | 10.0 | 5.0 | | | | | | | | | | | – | 100.0 |
| TEST PRODUCT 9 | 64.9 | 11.4 | 23.7 | | | | | | | | | | | – | 100.0 |
| TEST PRODUCT 9 | 10.0 | 70.0 | 20.0 | | | | | | | | | | | 1.0 | 99.0 |
| TEST PRODUCT 10 | 55.8 | 12.3 | 31.9 | | | | | | | | | | | 8.2 | 91.8 |
| TEST PRODUCT 11 | 75.1 | 10.0 | 14.9 | | | | | | | | | | | 15.0 | 85.0 |
| TEST PRODUCT 12 | 56.3 | 39.4 | 4.3 | | | | | | | | | | | – | 100.0 |
| TEST PRODUCT 13 | 33.9 | 55.0 | 11.1 | | | | | | | | | | | – | 100.0 |
| TEST PRODUCT 14 | 67.8 | 20.3 | 11.9 | | | | | | | | | | | 53.6 | 46.4 |
| TEST PRODUCT 15 | 75.5 | 12.9 | 11.6 | | | | | | | | | | | 6.5 | 93.5 |
| TEST PRODUCT 16 | 10.0 | 70.0 | 20.0 | | | | | | | | | | | – | 100.0 |
| TEST PRODUCT 17 | 55.7 | 2.0 | 42.3 | | | | | | | | | | | – | 100.0 |
| TEST PRODUCT 18 | 63.3 | 23.9 | 12.8 | | | | | | | | | | | 5.5 | 94.5 |
| TEST PRODUCT 19 | 30.1 | 5.5 | 64.4 | | | | | | | | | | | 15.9 | 84.1 |
| TEST PRODUCT 20 | 55.3 | 15.4 | 22.9 | | 6.4 | | | | | | | | | – | 100.0 |
| TEST PRODUCT 21 | 67.1 | 22.1 | 9.3 | | | | | | 1.5 | | | | | – | 100.0 |
| TEST PRODUCT 22 | 44.9 | 15.7 | 30.1 | | | 5.3 | | | | 4.0 | | | | 59.5 | 40.5 |
| TEST PRODUCT 23 | 67.7 | 16.9 | 5.8 | 3.5 | | | | 6.1 | | | | | | 11.3 | 88.7 |
| TEST PRODUCT 24 | 36.9 | 46.7 | 16.4 | | | | | | | | | | | – | 100.0 |
| TEST PRODUCT 25 | 70.6 | 15.2 | 14.2 | | | | | | | | | | | – | 100.0 |
| TEST PRODUCT 26 | 58.3 | 2.0 | 39.7 | | | | | | | | | | | 8.5 | 91.5 |
| TEST PRODUCT 27 | 22.2 | 70.0 | 7.8 | | | | | | | | | | | 55.3 | 44.7 |
| TEST PRODUCT 28 | 45.9 | 32.1 | 15.0 | | | | 7.0 | | | | | | | – | 100.0 |
| TEST PRODUCT 29 | 68.0 | 23.6 | 3.6 | 4.0 | | | 0.8 | | | | | | | – | 100.0 |
| TEST PRODUCT 30 | 62.5 | 20.4 | 14.1 | | | | | | 3.0 | | | | | – | 100.0 |
| TEST PRODUCT 31 | 56.9 | 15.5 | 17.6 | 5.0 | | 5.0 | | | | | | | | – | 100.0 |
| TEST PRODUCT 32 | 70.9 | 18.9 | 3.0 | 7.2 | | | | | | | | | | 25.0 | 75.0 |
| TEST PRODUCT 33 | 65.1 | 15.3 | 10.0 | 9.6 | | | | | | | | | | 29.0 | 71.0 |
| TEST PRODUCT 34 | 12.2 | 25.5 | 60.3 | | | | | 2.0 | | | | | | – | 100.0 |
| TEST PRODUCT 35 | 70.0 | 10.3 | 12.4 | 0.5 | 6.8 | | | | | | | | | – | 100.0 |
| TEST PRODUCT 36 | 51.2 | 33.5 | 10.3 | | | | | | | | 5.0 | | | 12.7 | 87.3 |
| TEST PRODUCT 37 | 60.6 | 30.1 | 8.0 | 1.3 | | | | | | | | | | 30.0 | 70.0 |
| TEST PRODUCT 38 | 23.0 | 2.0 | 65.0 | | 10.0 | | | | | | | | | 35.5 | 64.5 |
| TEST PRODUCT 39 | 32.5 | 17.5 | 48.9 | | 1.1 | | | | | | | | | 45.8 | 54.2 |
| TEST PRODUCT 40 | 24.7 | 28.1 | 39.2 | | 8.0 | | | | | | | | | 50.0 | 50.0 |
| TEST PRODUCT 41 | 20.0 | 70.0 | 3.0 | 6.0 | 1.0 | | | | | | | | | 55.9 | 44.1 |
| TEST PRODUCT 42 | 26.1 | 44.1 | 21.5 | | 6.3 | 2.0 | | | | | | | | 55.1 | 44.9 |
| TEST PRODUCT 43 | 10.0 | 47.5 | 35.9 | | | 6.6 | | | | | | | | 23.6 | 76.4 |
| TEST PRODUCT 44 | 10.0 | 50.0 | 34.5 | | | 5.5 | | | | | | | | 60.0 | 40.0 |
| TEST PRODUCT 45 | 15.6 | 46.3 | 37.1 | | | 1.0 | | | | | | | | 36.6 | 63.4 |
| TEST PRODUCT 46 | 15.6 | 48.8 | 32.4 | 1.5 | | 1.7 | | | | | | | | 30.2 | 69.8 |
| TEST PRODUCT 47 | 85.0 | 5.3 | 3.1 | | 2.3 | | 4.3 | | | | | | | 30.0 | 70.0 |
| TEST PRODUCT 48 | 40.8 | 40.9 | 12.8 | | 3.5 | 1.0 | 1.0 | | | | | | | 20.3 | 79.7 |
| TEST PRODUCT 49 | 29.9 | 40.3 | 28.1 | | | | 1.7 | | | | | | | 22.0 | 78.0 |
| TEST PRODUCT 50 | 33.1 | 36.4 | 26.3 | | | | 4.2 | | | | | | | 45.0 | 55.0 |
| TEST PRODUCT 51 | 10.0 | 70.0 | 15.7 | | | | 4.3 | | | | | | | 35.0 | 65.0 |
| TEST PRODUCT 52 | 30.8 | 2.0 | 65.0 | | | | 2.2 | | | | | | | 15.3 | 84.7 |
| TEST PRODUCT 53 | 44.6 | 41.2 | 8.3 | | 2.3 | | | 3.6 | | | | | | 18.6 | 81.4 |
| TEST PRODUCT 54 | 65.0 | 15.3 | 15.6 | | | | 2.0 | 2.1 | | | | | | 20.4 | 79.6 |
| TEST PRODUCT 55 | 45.1 | 2.3 | 48.7 | | | | | 3.9 | | | | | | 25.3 | 74.7 |
| TEST PRODUCT 56 | 32.5 | 52.3 | 6.8 | | | | | 8.4 | | | | | | 22.3 | 77.7 |
| TEST PRODUCT 57 | 22.7 | 2.3 | 65.0 | | | | | 10.0 | | | | | | 1.0 | 99.0 |
| TEST PRODUCT 58 | 77.3 | 5.2 | 10.0 | | | 3.9 | | 3.6 | | | | | | 1.0 | 99.0 |
| TEST PRODUCT 59 | 52.1 | 2.5 | 40.1 | | | | | | 5.3 | | | | | 10.3 | 89.7 |
| TEST PRODUCT 60 | 57.3 | 29.6 | 3.9 | | | | | | 9.2 | | | | | 12.3 | 87.7 |
| TEST PRODUCT 61 | 21.3 | 55.6 | 13.2 | | | | | | 9.9 | | | | | 18.6 | 81.4 |
| TEST PRODUCT 62 | 23.2 | 10.2 | 57.5 | | | | | | | 9.1 | | | | 20.5 | 79.5 |
| TEST PRODUCT 63 | 59.9 | 20.1 | 14.8 | | | | | | | 5.2 | | | | 25.0 | 75.0 |
| TEST PRODUCT 64 | 60.8 | 15.6 | 15.3 | | | | 3.4 | | | 4.9 | | | | 50.6 | 49.4 |
| TEST PRODUCT 65 | 62.5 | 10.8 | 22.3 | 2.3 | | | | | | 2.1 | | | | 55.6 | 44.4 |
| TEST PRODUCT 66 | 75.5 | 8.8 | 10.3 | | | | | | | | 5.4 | | | 60.0 | 40.0 |
| TEST PRODUCT 67 | 85.0 | 7.5 | 3.0 | 1.9 | | | | | | | 2.6 | | | 55.3 | 44.7 |
| TEST PRODUCT 68 | 75.0 | 5.5 | 15.8 | | | | | | 1.5 | | 2.2 | | | 45.2 | 54.8 |
| TEST PRODUCT 69 | 60.2 | 2.7 | 27.2 | | | | | | | | 9.9 | | | 35.6 | 64.4 |
| TEST PRODUCT 70 | 53.7 | 17.3 | 22.3 | | | | | | | | 2.6 | 4.1 | | 25.7 | 74.3 |
| TEST PRODUCT 71 | 20.5 | 5.5 | 65.0 | | | | | | | | | 9.0 | | 18.3 | 81.7 |
| TEST PRODUCT 72 | 65.8 | 10.5 | 15.3 | 2.0 | | | | | | | | 6.4 | | 15.2 | 84.8 |
| TEST PRODUCT 73 | 36.6 | 54.1 | 3.3 | | | | | | | | | | 6.0 | 25.0 | 75.0 |
| TEST PRODUCT 74 | 68.2 | 9.2 | 13.6 | 1.5 | | | | | | | | | 7.5 | 35.6 | 64.4 |

FIG.10

| COMPOSITION | Al | Cr | SiC | B | Ti | V | Y | Zr | Nb | Mo | Hf | Ta | W | C | N |
|---|---|---|---|---|---|---|---|---|---|---|---|---|---|---|---|
| TEST PRODUCT 1 | 85.5 | 4.5 | 10.0 | | | | | | | | | | | 0.9 | 99.1 |
| TEST PRODUCT 2 | 19.9 | 50.9 | 29.2 | | | | | | | | | | | 75.0 | 25.0 |
| TEST PRODUCT 3 | 45.0 | 54.3 | 0.7 | | | | | | | | | | | 61.5 | 38.5 |
| TEST PRODUCT 4 | 39.5 | 60.0 | 0.5 | | | | | | | | | | | – | 100.0 |
| TEST PRODUCT 5 | 44.8 | 4.9 | 50.3 | | | | | | | | | | | – | 100.0 |
| TEST PRODUCT 6 | 86.1 | 13.6 | 0.3 | | | | | | | | | | | – | 100.0 |
| TEST PRODUCT 7 | 85.0 | 5.0 | 10.0 | | | | | | | | | | | – | 100.0 |
| TEST PRODUCT 8 | 20.0 | 50.0 | 30.0 | | | | | | | | | | | – | 100.0 |
| TEST PRODUCT 9 | 40.1 | 50.0 | 9.9 | | | | | | | | | | | 6.5 | 93.5 |
| TEST PRODUCT 9 | 35.0 | 50.0 | 15.0 | | | | | | | | | | | 13.2 | 86.8 |
| TEST PRODUCT 10 | 52.3 | 15.4 | 32.3 | | | | | | | | | | | 6.5 | 93.5 |
| TEST PRODUCT 11 | 63.9 | 25.9 | 10.2 | | | | | | | | | | | – | 100.0 |
| TEST PRODUCT 12 | 75.0 | 5.0 | 20.0 | | | | | | | | | | | – | 100.0 |
| TEST PRODUCT 13 | 15.3 | 50.0 | 34.7 | | | | | | | | | | | – | 100.0 |
| TEST PRODUCT 14 | 30.9 | 25.2 | 43.9 | | | | | | | | | | | 25.8 | 74.2 |
| TEST PRODUCT 15 | 80.0 | 12.5 | 7.5 | | | | | | | | | | | 14.9 | 85.1 |
| TEST PRODUCT 16 | 85.0 | 5.0 | 3.0 | 7.0 | | | | | | | | | | – | 100.0 |
| TEST PRODUCT 17 | 65.5 | 25.3 | 5.5 | | 3.7 | | | | | | | | | – | 100.0 |
| TEST PRODUCT 18 | 57.3 | 32.4 | 8.0 | | | | 2.3 | | | | | | | – | 100.0 |
| TEST PRODUCT 19 | 38.9 | 12.3 | 44.9 | | | 3.9 | | | | | | | | 8.5 | 91.5 |
| TEST PRODUCT 20 | 65.3 | 22.3 | 12.4 | | | | | | | | | | | – | 100.0 |
| TEST PRODUCT 21 | 25.9 | 50.0 | 24.1 | | | | | | | | | | | – | 100.0 |
| TEST PRODUCT 22 | 20.1 | 50.0 | 29.9 | | | | | | | | | | | 23.3 | 76.7 |
| TEST PRODUCT 23 | 80.2 | 12.3 | 7.5 | | | | | | | | | | | 10.2 | 89.8 |
| TEST PRODUCT 24 | 65.3 | 19.9 | 11.2 | 3.6 | | | | | | | | | | – | 100.0 |
| TEST PRODUCT 25 | 53.1 | 23.3 | 14.3 | 5.0 | | | 4.3 | | | | | | | – | 100.0 |
| TEST PRODUCT 26 | 40.9 | 5.5 | 45.0 | | | | | | | 8.6 | | | | 7.5 | 92.5 |
| TEST PRODUCT 27 | 40.3 | 13.1 | 38.9 | 5.5 | | | | | | | | | 2.2 | 24.8 | 75.2 |
| TEST PRODUCT 28 | 35.1 | 35.0 | 25.1 | | | | 4.8 | | | | | | | – | 100.0 |
| TEST PRODUCT 29 | 23.9 | 45.2 | 27.2 | | | | | | | | 3.7 | | | – | 100.0 |
| TEST PRODUCT 30 | 36.1 | 50.0 | 13.9 | | | | | | | | | | | – | 100.0 |
| TEST PRODUCT 31 | 45.9 | 50.0 | 4.1 | | | | | | | | | | | – | 100.0 |
| TEST PRODUCT 32 | 55.1 | 30.3 | 14.6 | | | | | | | | | | | – | 100.0 |
| TEST PRODUCT 33 | 49.1 | 35.9 | 15.0 | | | | | | | | | | | – | 100.0 |
| TEST PRODUCT 34 | 20.0 | 50.0 | 20.0 | | | | 10.0 | | | | | | | – | 100.0 |
| TEST PRODUCT 35 | 44.1 | 33.3 | 15.6 | | | | | 7.1 | | | | | | – | 100.0 |
| TEST PRODUCT 36 | 53.6 | 17.2 | 20.0 | 6.5 | | | | 2.7 | | | | | | 60.0 | 40.0 |
| TEST PRODUCT 37 | 80.1 | 10.3 | 7.3 | 2.3 | | | | | | | | | | 35.7 | 64.3 |
| TEST PRODUCT 38 | 73.2 | 10.5 | 6.3 | 10.0 | | | | | | | | | | – | 100.0 |
| TEST PRODUCT 39 | 65.9 | 22.9 | 5.3 | 5.9 | | | | | | | | | | – | 100.0 |
| TEST PRODUCT 40 | 32.5 | 50.0 | 14.1 | 3.4 | | | | | | | | | | – | 100.0 |
| TEST PRODUCT 41 | 64.1 | 30.1 | 1.2 | 2.3 | 2.3 | | | | | | | | | – | 100.0 |
| TEST PRODUCT 42 | 70.9 | 15.8 | 10.2 | 1.3 | 1.8 | | | | | | | | | – | 100.0 |
| TEST PRODUCT 43 | 75.4 | 10.1 | 5.1 | 1.0 | 8.4 | | | | | | | | | – | 100.0 |
| TEST PRODUCT 44 | 72.4 | 12.3 | 11.0 | 1.5 | | 2.8 | | | | | | | | – | 100.0 |
| TEST PRODUCT 45 | 65.4 | 20.6 | 8.4 | 2.6 | 1.0 | 2.0 | | | | | | | | – | 100.0 |
| TEST PRODUCT 46 | 57.8 | 28.5 | 5.4 | 2.5 | 3.5 | 2.3 | | | | | | | | – | 100.0 |
| TEST PRODUCT 47 | 38.9 | 15.6 | 40.0 | 1.3 | | 4.2 | | | | | | | | – | 100.0 |
| TEST PRODUCT 48 | 35.0 | 50.0 | 5.0 | | | | 10.0 | | | | | | | – | 100.0 |
| TEST PRODUCT 49 | 35.5 | 48.6 | 10.0 | 2.5 | | | 3.4 | | | | | | | – | 100.0 |
| TEST PRODUCT 50 | 47.1 | 45.0 | 1.0 | | | 2.5 | 4.4 | | | | | | | – | 100.0 |
| TEST PRODUCT 51 | 45.2 | 35.7 | 12.4 | 5.2 | | | | 1.5 | | | | | | – | 100.0 |
| TEST PRODUCT 52 | 64.3 | 20.2 | 10.5 | 2.0 | | 1.5 | | 1.5 | | | | | | – | 100.0 |
| TEST PRODUCT 53 | 75.2 | 15.0 | 3.6 | 3.0 | | | | 3.2 | | | | | | – | 100.0 |
| TEST PRODUCT 54 | 44.9 | 5.0 | 45.0 | | | 1.5 | | 3.6 | | | | | | – | 100.0 |
| TEST PRODUCT 55 | 55.4 | 30.4 | 8.4 | 2.0 | | 3.0 | | | 0.8 | | | | | – | 100.0 |
| TEST PRODUCT 56 | 59.1 | 23.5 | 10.4 | | 5.0 | | | | 2.0 | | | | | – | 100.0 |
| TEST PRODUCT 57 | 80.1 | 5.0 | 5.0 | 1.6 | | 1.2 | | | 7.1 | | | | | 12.0 | 88.0 |
| TEST PRODUCT 58 | 85.0 | 5.0 | 2.0 | | | | | | 8.0 | | | | | 35.4 | 64.6 |
| TEST PRODUCT 59 | 74.2 | 10.9 | 5.0 | | | | | | 9.9 | | | | | 1.6 | 98.4 |
| TEST PRODUCT 60 | 70.9 | 13.4 | 5.9 | | | | | | 3.5 | 6.3 | | | | 10.5 | 89.5 |
| TEST PRODUCT 61 | 68.2 | 20.1 | 6.3 | 1.0 | | | | | | 4.4 | | | | 60.0 | 40.0 |
| TEST PRODUCT 62 | 68.0 | 22.5 | 1.0 | 7.5 | | | | | | 1.0 | | | | 30.0 | 70.0 |
| TEST PRODUCT 63 | 55.9 | 23.3 | 15.4 | | | | | | | | 5.4 | | | 1.6 | 98.4 |
| TEST PRODUCT 64 | 50.2 | 20.9 | 22.3 | 3.5 | | | | | | | 3.1 | | | 25.3 | 74.7 |
| TEST PRODUCT 65 | 48.4 | 30.1 | 15.8 | | 2.0 | | | | | | 3.7 | | | 55.9 | 44.1 |
| TEST PRODUCT 66 | 35.2 | 11.4 | 45.0 | | | | | | | | 8.4 | | | 60.0 | 40.0 |
| TEST PRODUCT 67 | 43.9 | 44.3 | 5.5 | 2.5 | | | | | 2.5 | | | 1.3 | | 5.6 | 94.4 |
| TEST PRODUCT 68 | 35.0 | 50.0 | 5.0 | | | | | | | | | 10.0 | | 22.3 | 77.7 |
| TEST PRODUCT 69 | 40.3 | 35.5 | 18.5 | | | | | | | | 1.7 | 4.0 | | 1.0 | 99.0 |
| TEST PRODUCT 70 | 45.6 | 30.8 | 14.3 | | | | | 2.4 | | | | 6.9 | | 5.0 | 95.0 |
| TEST PRODUCT 71 | 40.9 | 44.3 | 5.6 | | | | | | 5.5 | | | | 3.7 | 15.5 | 84.5 |
| TEST PRODUCT 72 | 72.3 | 16.5 | 2.0 | | | | | | | 3.5 | 1.5 | | 4.2 | 20.0 | 80.0 |
| TEST PRODUCT 73 | 66.2 | 18.4 | 9.0 | 2.3 | | | | | | | | | 4.1 | 35.0 | 65.0 |
| TEST PRODUCT 74 | 83.2 | 13.6 | 12.3 | | | 2.5 | | 1.0 | | | | | 2.5 | 55.0 | 45.0 |

FIG.11

| COMPOSITION | FILM THICKNESS OF RESPECTIVE NANOLAYERS | | | | | INTER-MEDIATE LAYER (nm) | LAYER-A SINGLE LAYER THICKNESS TA (nm) | LAYER-B SINGLE LAYER THICKNESS TB (nm) | NUMBER OF LAMINATED LAYER PAIRS OF LAYERS A/B AND NANOLAYER-ALTERNATING LAYERS | TOTAL FILM THICKNESS (μm) | RATIO TA/TNL OF THICKNESS BETWEEN LAYER A AND NANOLAYER-ALTERNATING LAYER | RATIO TB/TNL OF THICKNESS BETWEEN LAYER B AND NANOLAYER-ALTERNATING LAYER |
|---|---|---|---|---|---|---|---|---|---|---|---|---|
| | NANO-LAYER A (nm) | NANO-LAYER B (nm) | LAYER C (nm) | NUMBER OF LAMINATED LAYER PAIRS OF NANOLAYERS A AND C OR NANOLAYERS B AND C | NANOLAYER-ALTERNATING LAYER THICKNESS TNL (nm) | | | | | | | |
| TEST PRODUCT 1 | – | 0 | 203 | 12 | 2436 | 18 | 200 | 100 | 8 | 21.9 | 0.08 | 0.04 |
| TEST PRODUCT 2 | – | 0.2 | 0.2 | 9 | 4 | 15 | 0.4 | 0.3 | 100 | 0.45 | 0.11 | 0.08 |
| TEST PRODUCT 3 | – | 450 | 0.4 | 5 | 2252 | 1230 | 1200 | 1020 | 5 | 23.6 | 0.53 | 0.45 |
| TEST PRODUCT 4 | – | 550 | 0.5 | 6 | 3303 | 1200 | 500 | 200 | 5 | 21.2 | 0.15 | 0.06 |
| TEST PRODUCT 5 | – | 0.2 | 1.0 | 500 | 600 | 5 | 0.3 | 0.4 | 13 | 7.8 | 0.00 | 0.00 |
| TEST PRODUCT 6 | – | 540 | 0.3 | 8 | 4322 | 15 | 1020 | 250 | 4 | 22.3 | 0.24 | 0.06 |
| TEST PRODUCT 7 | – | 0.5 | 0.5 | 1 | 1 | 20 | 0.5 | 0.5 | 250 | 0.5 | 0.50 | 0.50 |
| TEST PRODUCT 8 | – | 6 | 3 | 10 | 90 | 50 | 25 | 18 | 9 | 1.2 | 0.28 | 0.20 |
| TEST PRODUCT 9 | 50 | – | 30 | 4 | 320 | 603 | 400 | 450 | 6 | 7.6 | 1.25 | 1.41 |
| TEST PRODUCT 9 | – | 8 | 10 | 7 | 126 | 210 | 150 | 80 | 45 | 16.2 | 1.19 | 0.63 |
| TEST PRODUCT 10 | 245 | – | 120 | 2 | 720 | 350 | 1000 | 500 | 2 | 4.8 | 1.39 | 0.69 |
| TEST PRODUCT 11 | – | 10 | 50 | 6 | 360 | 480 | 480 | 350 | 8 | 10.0 | 1.33 | 0.97 |
| TEST PRODUCT 12 | 0.5 | – | 0.5 | 240 | 240 | 500 | 900 | 250 | 9 | 13.0 | 3.75 | 1.04 |
| TEST PRODUCT 13 | 5 | – | 15 | 30 | 600 | 250 | 150 | 300 | 6 | 6.6 | 0.25 | 0.50 |
| TEST PRODUCT 14 | – | 20 | 10 | 6 | 180 | 600 | 200 | 150 | 5 | 3.3 | 1.11 | 0.83 |
| TEST PRODUCT 15 | – | 10 | 5 | 1 | 15 | 250 | 30 | 30 | 100 | 7.8 | 2.00 | 2.00 |
| TEST PRODUCT 16 | 80 | – | 150 | 2 | 460 | 1000 | 240 | 240 | 7 | 7.6 | 0.52 | 0.52 |
| TEST PRODUCT 17 | 301 | – | 199 | 2 | 1000 | 340 | 500 | 263 | 9 | 16.2 | 0.50 | 0.26 |
| TEST PRODUCT 18 | 8 | – | 2 | 50 | 500 | 360 | 220 | 280 | 2 | 2.4 | 0.44 | 0.56 |
| TEST PRODUCT 19 | 15 | – | 4 | 5 | 95 | 452 | 50 | 100 | 1 | 0.7 | 0.53 | 1.05 |
| TEST PRODUCT 20 | 500 | – | 450 | 1 | 950 | 600 | 800 | 580 | 6 | 14.6 | 0.84 | 0.61 |
| TEST PRODUCT 21 | – | 15 | 0.5 | 33 | 512 | 100 | 380 | 400 | 15 | 19.5 | 0.74 | 0.78 |
| TEST PRODUCT 22 | – | 30 | 45 | 2 | 150 | 520 | 350 | 290 | 8 | 6.8 | 2.33 | 1.93 |
| TEST PRODUCT 23 | – | 6 | 3 | 5 | 45 | 520 | 25 | 9 | 34 | 3.2 | 0.56 | 0.20 |
| TEST PRODUCT 24 | – | 20 | 10 | 3 | 90 | 511 | 300 | 250 | 5 | 3.7 | 3.33 | 2.78 |
| TEST PRODUCT 25 | – | 50 | 100 | 3 | 450 | 450 | 150 | 200 | 1 | 1.3 | 0.33 | 0.44 |
| TEST PRODUCT 26 | 15 | – | 5 | 30 | 600 | 300 | 350 | 200 | 10 | 11.8 | 0.58 | 0.33 |
| TEST PRODUCT 27 | 20 | – | 15 | 8 | 280 | 520 | 150 | 100 | 6 | 3.7 | 0.54 | 0.36 |
| TEST PRODUCT 28 | – | 200 | 400 | 1 | 600 | 855 | 500 | 350 | 4 | 6.7 | 0.83 | 0.58 |
| TEST PRODUCT 29 | – | 7 | 2 | 50 | 450 | 520 | 600 | 268 | 5 | 7.1 | 1.33 | 0.60 |
| TEST PRODUCT 30 | 9 | – | 5 | 25 | 350 | 250 | 245 | 590 | 8 | 9.7 | 0.70 | 1.69 |
| TEST PRODUCT 31 | 20 | – | 12 | 5 | 160 | 498 | 260 | 130 | 5 | 3.2 | 1.63 | 0.81 |
| TEST PRODUCT 32 | – | 2 | 5 | 10 | 70 | 850 | 40 | 30 | 14 | 2.9 | 0.57 | 0.43 |
| TEST PRODUCT 33 | – | 4 | 4 | 125 | 1000 | 1000 | 280 | 209 | 8 | 9.9 | 0.28 | 0.21 |
| TEST PRODUCT 34 | 15 | – | 35 | 3 | 150 | 200 | 150 | 150 | 12 | 5.6 | 1.00 | 1.00 |
| TEST PRODUCT 35 | 45 | – | 100 | 5 | 725 | 580 | 500 | 1000 | 5 | 11.7 | 0.69 | 1.38 |
| TEST PRODUCT 36 | 100 | – | 50 | 3 | 450 | 420 | 300 | 290 | 10 | 10.8 | 0.67 | 0.64 |
| TEST PRODUCT 37 | – | 10 | 20 | 9 | 270 | 50 | 120 | 100 | 14 | 6.9 | 0.44 | 0.37 |
| TEST PRODUCT 38 | – | 30 | 10 | 10 | 400 | 500 | 140 | 100 | 3 | 2.4 | 0.35 | 0.25 |
| TEST PRODUCT 39 | – | 45 | 16 | 15 | 915 | 290 | 500 | 450 | 5 | 9.6 | 0.55 | 0.49 |
| TEST PRODUCT 40 | – | 50 | 20 | 3 | 210 | 546 | 50 | 50 | 3 | 1.5 | 0.24 | 0.24 |
| TEST PRODUCT 41 | – | 150 | 120 | 3 | 810 | 120 | 1000 | 800 | 5 | 13.1 | 1.23 | 0.99 |
| TEST PRODUCT 42 | – | 7 | 280 | 3 | 861 | 180 | 250 | 200 | 3 | 4.1 | 0.29 | 0.23 |
| TEST PRODUCT 43 | – | 200 | 470 | 1 | 670 | 90 | 800 | 200 | 8 | 13.4 | 1.19 | 0.30 |
| TEST PRODUCT 44 | – | 400 | 500 | 1 | 900 | 20 | 500 | 500 | 6 | 11.4 | 0.56 | 0.56 |
| TEST PRODUCT 45 | – | 68 | 280 | 3 | 984 | 110 | 480 | 600 | 8 | 16.6 | 0.49 | 0.61 |
| TEST PRODUCT 46 | – | 0.5 | 150 | 6 | 903 | 259 | 320 | 310 | 3 | 4.9 | 0.35 | 0.34 |
| TEST PRODUCT 47 | – | 150 | 100 | 3 | 750 | 120 | 150 | 150 | 10 | 10.6 | 0.20 | 0.20 |
| TEST PRODUCT 48 | – | 500 | 50 | 1 | 550 | 880 | 130 | 500 | 6 | 8.0 | 0.24 | 0.91 |
| TEST PRODUCT 49 | – | 0.5 | 35 | 5 | 178 | 50 | 50 | 40 | 12 | 3.3 | 0.28 | 0.23 |
| TEST PRODUCT 50 | – | 50 | 89 | 7 | 973 | 60 | 290 | 270 | 13 | 20.0 | 0.30 | 0.28 |
| TEST PRODUCT 51 | 50 | – | 50 | 2 | 200 | 1000 | 1000 | 570 | 10 | 18.7 | 5.00 | 2.85 |
| TEST PRODUCT 52 | 10 | – | 6 | 5 | 80 | 350 | 400 | 360 | 8 | 7.1 | 5.00 | 4.50 |
| TEST PRODUCT 53 | 8 | – | 10 | 7 | 126 | 400 | 650 | 540 | 6 | 8.3 | 5.16 | 4.29 |
| TEST PRODUCT 54 | 8 | – | 6 | 24 | 336 | 160 | 75 | 170 | 12 | 7.1 | 0.23 | 0.51 |
| TEST PRODUCT 55 | 0.5 | – | 2 | 2 | 2 | 500 | 0.5 | 0.5 | 100 | 0.6 | 0.25 | 0.25 |
| TEST PRODUCT 56 | 0.5 | – | 1.0 | 2 | 3 | 120 | 1 | 1 | 1500 | 7.5 | 0.33 | 0.33 |
| TEST PRODUCT 57 | 0.5 | – | 30 | 5 | 153 | 20 | 35 | 70 | 50 | 12.9 | 0.23 | 0.46 |
| TEST PRODUCT 58 | 2.5 | – | 50 | 5 | 263 | 180 | 180 | 200 | 20 | 13.0 | 0.69 | 0.76 |
| TEST PRODUCT 59 | 5 | – | 50 | 14 | 770 | 600 | 1000 | 1000 | 7 | 20.0 | 1.30 | 1.30 |
| TEST PRODUCT 60 | 10 | – | 190 | 2 | 400 | 1000 | 560 | 240 | 3 | 4.6 | 1.40 | 0.60 |
| TEST PRODUCT 61 | 30 | – | 15 | 9 | 405 | 350 | 450 | 110 | 5 | 6.1 | 1.11 | 0.27 |
| TEST PRODUCT 62 | 20 | – | 150 | 3 | 510 | 500 | 300 | 600 | 6 | 9.0 | 0.59 | 1.18 |
| TEST PRODUCT 63 | 15 | – | 2 | 11 | 187 | 300 | 120 | 60 | 9 | 3.6 | 0.64 | 0.32 |
| TEST PRODUCT 64 | 10 | – | 8 | 15 | 270 | 90 | 100 | 300 | 10 | 6.6 | 0.37 | 1.11 |
| TEST PRODUCT 65 | 45 | – | 10 | 1 | 55 | 120 | 380 | 300 | 14 | 10.4 | 6.91 | 5.45 |
| TEST PRODUCT 66 | 80 | – | 2 | 8 | 656 | 135 | 500 | 500 | 7 | 7.1 | 0.76 | 0.76 |
| TEST PRODUCT 67 | 85 | – | 7 | 5 | 460 | 20 | 105 | 250 | 15 | 12.2 | 0.23 | 0.54 |
| TEST PRODUCT 68 | 185 | – | 15 | 5 | 1000 | 1000 | 300 | 300 | 3 | 5.8 | 0.30 | 0.30 |
| TEST PRODUCT 69 | 66 | – | 24 | 11 | 990 | 20 | 290 | 325 | 9 | 14.5 | 0.29 | 0.33 |
| TEST PRODUCT 70 | 254 | – | 80 | 2 | 668 | 600 | 250 | 150 | 12 | 13.4 | 0.37 | 0.22 |
| TEST PRODUCT 71 | 173 | – | 160 | 3 | 999 | 180 | 480 | 230 | 4 | 7.0 | 0.48 | 0.23 |
| TEST PRODUCT 72 | 18 | – | 15 | 3 | 99 | 220 | 535 | 50 | 8 | 5.7 | 5.40 | 0.51 |
| TEST PRODUCT 73 | 5 | – | 0.5 | 6 | 33 | 450 | 330 | 150 | 8 | 4.6 | 10.00 | 4.55 |
| TEST PRODUCT 74 | 35 | – | 2 | 3 | 111 | 170 | 200 | 80 | 9 | 3.7 | 1.80 | 0.72 |

FIG.12

| COMPOSITION | FILM HARDNESS HV0.025 | OXIDE LAYER THICKNESS (μm) | CUTTING DISTANCE (m) | DETERMINATION | NOTES |
|---|---|---|---|---|---|
| TEST PRODUCT 1 | | PEELING-OFF | | × | NG PRODUCT |
| TEST PRODUCT 2 | 1990 | TOTAL OXIDATION | 290 | × | CONVENTIONAL PRODUCT |
| TEST PRODUCT 3 | 2310 | TOTAL OXIDATION | 290 | × | CONVENTIONAL PRODUCT |
| TEST PRODUCT 4 | | PEELING-OFF | | × | NG PRODUCT |
| TEST PRODUCT 5 | 2080 | TOTAL OXIDATION | 290 | × | CONVENTIONAL PRODUCT |
| TEST PRODUCT 6 | 2220 | TOTAL OXIDATION | 440 | × | CONVENTIONAL PRODUCT |
| TEST PRODUCT 7 | 2890 | 0.36 | 512 | ○ | INVENTIVE PRODUCT |
| TEST PRODUCT 8 | 3110 | 0.23 | 710 | ○ | INVENTIVE PRODUCT |
| TEST PRODUCT 9 | 3200 | 0.31 | 752 | ○ | INVENTIVE PRODUCT |
| TEST PRODUCT 9 | 3090 | 0.15 | 862 | ○ | INVENTIVE PRODUCT |
| TEST PRODUCT 10 | 2990 | 0.36 | 754 | ○ | INVENTIVE PRODUCT |
| TEST PRODUCT 11 | 3240 | 0.29 | 903 | ○ | INVENTIVE PRODUCT |
| TEST PRODUCT 12 | 3210 | 0.33 | 752 | ○ | INVENTIVE PRODUCT |
| TEST PRODUCT 13 | 3350 | 0.25 | 699 | ○ | INVENTIVE PRODUCT |
| TEST PRODUCT 14 | 3100 | 0.11 | 700 | ○ | INVENTIVE PRODUCT |
| TEST PRODUCT 15 | 3290 | 0.36 | 630 | ○ | INVENTIVE PRODUCT |
| TEST PRODUCT 16 | 3110 | 0.29 | 780 | ○ | INVENTIVE PRODUCT |
| TEST PRODUCT 17 | 3520 | 0.41 | 885 | ○ | INVENTIVE PRODUCT |
| TEST PRODUCT 18 | 3100 | 0.38 | 598 | ○ | INVENTIVE PRODUCT |
| TEST PRODUCT 19 | 2980 | 0.39 | 593 | ○ | INVENTIVE PRODUCT |
| TEST PRODUCT 20 | 3360 | 0.36 | 782 | ○ | INVENTIVE PRODUCT |
| TEST PRODUCT 21 | 3250 | 0.30 | 802 | ○ | INVENTIVE PRODUCT |
| TEST PRODUCT 22 | 3200 | 0.33 | 814 | ○ | INVENTIVE PRODUCT |
| TEST PRODUCT 23 | 3170 | 0.38 | 705 | ○ | INVENTIVE PRODUCT |
| TEST PRODUCT 24 | 3380 | 0.29 | 796 | ○ | INVENTIVE PRODUCT |
| TEST PRODUCT 25 | 3310 | 0.22 | 512 | ○ | INVENTIVE PRODUCT |
| TEST PRODUCT 26 | 3396 | 0.20 | 788 | ○ | INVENTIVE PRODUCT |
| TEST PRODUCT 27 | 3150 | 0.31 | 613 | ○ | INVENTIVE PRODUCT |
| TEST PRODUCT 28 | 3290 | 0.39 | 695 | ○ | INVENTIVE PRODUCT |
| TEST PRODUCT 29 | 3500 | 0.11 | 901 | ○ | INVENTIVE PRODUCT |
| TEST PRODUCT 30 | 3350 | 0.25 | 850 | ○ | INVENTIVE PRODUCT |
| TEST PRODUCT 31 | 3280 | 0.32 | 820 | ○ | INVENTIVE PRODUCT |
| TEST PRODUCT 32 | 3310 | 0.21 | 760 | ○ | INVENTIVE PRODUCT |
| TEST PRODUCT 33 | 3450 | 0.12 | 850 | ○ | INVENTIVE PRODUCT |
| TEST PRODUCT 34 | 3100 | 0.25 | 810 | ○ | INVENTIVE PRODUCT |
| TEST PRODUCT 35 | 3430 | 0.29 | 880 | ○ | INVENTIVE PRODUCT |
| TEST PRODUCT 36 | 3290 | 0.33 | 780 | ○ | INVENTIVE PRODUCT |
| TEST PRODUCT 37 | 3210 | 0.31 | 896 | ○ | INVENTIVE PRODUCT |
| TEST PRODUCT 38 | 3340 | 0.25 | 540 | ○ | INVENTIVE PRODUCT |
| TEST PRODUCT 39 | 3120 | 0.11 | 859 | ○ | INVENTIVE PRODUCT |
| TEST PRODUCT 40 | 2990 | 0.41 | 505 | ○ | INVENTIVE PRODUCT |
| TEST PRODUCT 41 | 3340 | 0.36 | 695 | ○ | INVENTIVE PRODUCT |
| TEST PRODUCT 42 | 3010 | 0.16 | 505 | ○ | INVENTIVE PRODUCT |
| TEST PRODUCT 43 | 3310 | 0.25 | 900 | ○ | INVENTIVE PRODUCT |
| TEST PRODUCT 44 | 3190 | 0.37 | 887 | ○ | INVENTIVE PRODUCT |
| TEST PRODUCT 45 | 3320 | 0.12 | 849 | ○ | INVENTIVE PRODUCT |
| TEST PRODUCT 46 | 3090 | 0.33 | 580 | ○ | INVENTIVE PRODUCT |
| TEST PRODUCT 47 | 3120 | 0.38 | 790 | ○ | INVENTIVE PRODUCT |
| TEST PRODUCT 48 | 3380 | 0.36 | 877 | ○ | INVENTIVE PRODUCT |
| TEST PRODUCT 49 | 3240 | 0.22 | 698 | ○ | INVENTIVE PRODUCT |
| TEST PRODUCT 50 | 3190 | 0.38 | 698 | ○ | INVENTIVE PRODUCT |
| TEST PRODUCT 51 | 3240 | 0.22 | 741 | ○ | INVENTIVE PRODUCT |
| TEST PRODUCT 52 | 3370 | 0.37 | 789 | ○ | INVENTIVE PRODUCT |
| TEST PRODUCT 53 | 3010 | 0.25 | 512 | ○ | INVENTIVE PRODUCT |
| TEST PRODUCT 54 | 3250 | 0.14 | 700 | ○ | INVENTIVE PRODUCT |
| TEST PRODUCT 55 | 2990 | 0.21 | 560 | ○ | INVENTIVE PRODUCT |
| TEST PRODUCT 56 | 3400 | 0.44 | 874 | ○ | INVENTIVE PRODUCT |
| TEST PRODUCT 57 | 3500 | 0.21 | 890 | ○ | INVENTIVE PRODUCT |
| TEST PRODUCT 58 | 3490 | 0.14 | 784 | ○ | INVENTIVE PRODUCT |
| TEST PRODUCT 59 | 3380 | 0.39 | 789 | ○ | INVENTIVE PRODUCT |
| TEST PRODUCT 60 | 3290 | 0.44 | 805 | ○ | INVENTIVE PRODUCT |
| TEST PRODUCT 61 | 3520 | 0.28 | 790 | ○ | INVENTIVE PRODUCT |
| TEST PRODUCT 62 | 3500 | 0.40 | 810 | ○ | INVENTIVE PRODUCT |
| TEST PRODUCT 63 | 3520 | 0.12 | 780 | ○ | INVENTIVE PRODUCT |
| TEST PRODUCT 64 | 3000 | 0.11 | 589 | ○ | INVENTIVE PRODUCT |
| TEST PRODUCT 65 | 3250 | 0.38 | 800 | ○ | INVENTIVE PRODUCT |
| TEST PRODUCT 66 | 3050 | 0.22 | 560 | ○ | INVENTIVE PRODUCT |
| TEST PRODUCT 67 | 3450 | 0.26 | 718 | ○ | INVENTIVE PRODUCT |
| TEST PRODUCT 68 | 3290 | 0.24 | 680 | ○ | INVENTIVE PRODUCT |
| TEST PRODUCT 69 | 3450 | 0.11 | 710 | ○ | INVENTIVE PRODUCT |
| TEST PRODUCT 70 | 3590 | 0.33 | 740 | ○ | INVENTIVE PRODUCT |
| TEST PRODUCT 71 | 3450 | 0.31 | 682 | ○ | INVENTIVE PRODUCT |
| TEST PRODUCT 72 | 3280 | 0.18 | 870 | ○ | INVENTIVE PRODUCT |
| TEST PRODUCT 73 | 3470 | 0.28 | 630 | ○ | INVENTIVE PRODUCT |
| TEST PRODUCT 74 | 3350 | 0.15 | 780 | ○ | INVENTIVE PRODUCT |

HARD COATING AND MEMBER COATED WITH HARD COATING

TECHNICAL FIELD

The present invention relates to a hard film and a hard film-coated member excellent in abrasion resistance and welding resistance and, more particularly, to a hard film excellent in abrasion resistance and welding resistance formed by alternately laminating a layer A of AlTiCr nitride, a layer B of AlTiCr carbonitride, and an alternating layer of a nanolayer A or nanolayer B having the same composition as the layer A or the layer B and a nano-order thickness and a nanolayer C of AlCr(SiC) nitride or AlCr(SiC) carbonitride having a nano-order thickness.

BACKGROUND ART

For various working tools including cutting tools such as end mills, drills, milling cutters, and tool bits, and non-cutting tools such as thread forming taps, rolling tools, and press dies, or various tool members such as friction parts required to have abrasion resistance, it is proposed to improve the abrasion resistance and durability by coating a surface of a base material made of cemented carbide or high-speed tool steel with a hard film.

In this regard, Patent Document 1 and Non-Patent Document 1 propose an end mill coated with a TiAlN-based/TiCrN-based hard film. Patent Document 2 proposes an end mill coated with a hard film composed of an AlCrN- and TiSiN-based multilayer structure.

PRIOR ART DOCUMENTS

Patent Documents

Patent Document 1: WO 2013/000557
Patent Document 2: WO 2008/146727

Non-Patent Document

Non-Patent Document 1: O. Durand-Drouhin, A. E. Santana, A. Karimi, V. H. Derflinger, A. Schutze, "Mechanical Properties and failure modes of TiAl(Si)N single and multilayer thin films", Surface and Coatings Technology (Switzerland), Elsevier Science, 2003, Vols. 163-164, pp. 260-266

SUMMARY OF THE INVENTION

Technical Problem

However, the end mills described in Patent Document 1 and Non-Patent Document 1 have a problem that sufficient abrasion resistance cannot be achieved when used for cutting of carbon steel, alloy steel, or heat-treated steel. Additionally, the end mill described in Patent Document 2 has a problem that sufficient performance cannot be achieved due to insufficient welding resistance when used for cutting work of carbon steel, alloy steel, or heat-treated steel.

The present invention was conceived in view of the situations and it is therefore an object of the present invention to provide a hard film-coated member achieving abrasion resistance for cutting of carbon steel etc. and achieving welding resistance for cutting of alloy steel, heat-treated steel, etc.

As a result of various studies in view of the situations, the present inventors found the fact that by using for a tool a hard film formed by alternately laminating a layer A of AlTiCr nitride, a layer B of AlTiCr carbonitride, and an alternating layer of a nanolayer A or nanolayer B having the same composition as the layer A or the layer B and a nano-order thickness and a nanolayer C of AlCr(SiC) nitride or AlCr(SiC) carbonitride having a nano-order thickness such that a total film thickness is 20 μm or less, the hard film has excellent abrasion resistance and welding resistance, which makes the life of the tool longer. The present invention was conceived based on this knowledge.

Solution to Problem

Specifically, a first aspect of the present invention provides a hard film (a) for coating a surface of a base material, the hard film (b) configured to include a layer A, a layer B, and a nanolayer-alternating layer alternately laminated by a physical vapor deposition method to a total film thickness of 0.5 to 20 μm, wherein (c) the layer A is an AlTiCr nitride having a composition formula of $(Al_a Ti_b Cr_c \alpha_d)N$, where α is one or more elements selected from a group consisting of C, B, Si, V, Y, Zr, Nb, Mo, Hf, Ta, and W and atomic ratios a, b, c, d respectively satisfy $0.10 \leq a \leq 0.85$, $0.02 \leq b \leq 0.70$, $0.03 \leq c \leq 0.65$, $0 \leq d \leq 0.10$, and $a+b+c+d=1$, and has a thickness of 0.5 to 1000 nm, wherein (d) the layer B is an AlTiCr nitride or AlTiCr carbonitride having a composition formula of $(Al_e Ti_f Cr_g \beta_h)C_x N_{1-x}$, where β is one or more elements selected from a group consisting of B, Si, V, Y, Zr, Nb, Mo, Hf, Ta, and W and atomic ratios e, f, g, h, and X respectively satisfy $0.10 \leq e \leq 0.85$, $0.02 \leq f \leq 0.70$, $0.03 \leq g \leq 0.65$, $0 \leq h \leq 0.10$, $e+f+g+h=1$, and $0 \leq X \leq 0.6$, and has a thickness of 0.5 to 1000 nm, wherein (e) the nanolayer-alternating layer is formed by alternately laminating a nanolayer A or a nanolayer B having the same composition as the layer A or the layer B and a layer C and has a thickness of 1 to 1000 nm, wherein (f) the nanolayer A and the nanolayer B each have a thickness of 0.5 to 500 nm, and wherein (g) the layer C is an AlCr(SiC) nitride or AlCr(SiC) carbonitride having a composition formula of $[Al_i Cr_j(SiC)_k \gamma_l]C_Y N_{1-Y}$, where γ is one or more elements selected from a group consisting of B, Ti, V, Y, Zr, Nb, Mo, Hf, Ta, and W and atomic ratios i, j, k, l, and Y respectively satisfy $0.20 \leq i \leq 0.85$, $0.05 \leq j \leq 0.50$, $0.01 \leq k \leq 0.45$, $0 \leq l \leq 0.10$, $i+j+k+l=1$, and $0 \leq Y \leq 0.6$, and has a thickness of 0.5 to 500 nm.

A second aspect of the present invention provides the hard film recited in the first aspect of the invention, wherein a value $T_A/T_{NL}$ of a ratio between a film thickness $T_A$ of the layer A and a film thickness $T_{NL}$ of the nanolayer-alternating layer is 0.2 to 10 while a value $T_B/T_{NL}$ of a ratio between a film thickness $T_B$ of the layer B and the film thickness $T_{NL}$ of the nanolayer-alternating layer is 0.2 to 10.

A third aspect of the present invention provides the hard film recited in the first or second aspect of the invention, further including a surface layer outside the hard film, wherein the surface layer is made of the same material as the layer A, the layer B, the layer C, or the nanolayer-alternating layer.

A fourth aspect of the present invention provides the hard film recited in any one of the first to third aspects of the invention, wherein the hard film is directly applied to the base material.

A fifth aspect of the present invention provides the hard film recited in any one of first to fourth aspects of the invention, wherein the hard film is applied to the base material via an interface layer, and wherein the interface layer is configured to have a thickness of 20 to 1000 nm and made of the same material as the layer A, the layer B, the layer C, or the nanolayer-alternating layer.

A sixth aspect of the present invention provides a hard film-coated member partially or entirely coated with the hard film recited in any one of the first to fifth aspects of the invention.

Advantageous Effects of Invention

According to the first aspect of the invention, the hard film for coating a surface of the base material is configured to have a film thickness of 0.5 to 20 μm by using a physical vapor deposition method to alternately laminate the layer A, the layer B, and the nanolayer-alternating layer; the layer A is the AlTiCr nitride having the composition formula of $(Al_a Ti_b Cr_c \alpha_d)N$, where α is one or more elements selected from the group consisting of C, B, Si, V, Y, Zr, Nb, Mo, Hf, Ta, and W and the atomic ratios a, b, c, d respectively satisfy $0.10 \leq a \leq 0.85$, $0.02 \leq b \leq 0.70$, $0.03 \leq c \leq 0.65$, $0 \leq d \leq 0.10$, and $a+b+c+d=1$, and has a thickness of 0.5 to 1000 nm; the layer B is an AlTiCr nitride or AlTiCr carbonitride having the composition formula of $(Al_e Ti_f Cr_g \beta_h)C_x N_{1-X}$, where β is one or more elements selected from the group consisting of B, Si, V, Y, Zr, Nb, Mo, Hf, Ta, and W and the atomic ratios e, f, g, h, and X respectively satisfy $0.10 \leq e \leq 0.85$, $0.02 \leq f \leq 0.70$, $0.03 \leq g \leq 0.65$, $0 \leq h \leq 0.10$, $e+f+g+h=1$, and $0 \leq X \leq 0.6$, and has a thickness of 0.5 to 1000 nm; the nanolayer-alternating layer is formed by alternately laminating the nanolayer A or the nanolayer B having the same composition as the layer A or the layer B and the layer C and has a thickness of 1 to 1000 nm; the nanolayer A and the nanolayer B each have a thickness of 0.5 to 500 nm; the layer C is the AlCr(SiC) nitride or AlCr(SiC) carbonitride having the composition formula of $[Al_i Cr_j (SiC)_k \gamma_l] C_Y N_{1-Y}$, where γ is one or more elements selected from the group consisting of B, Ti, V, Y, Zr, Nb, Mo, Hf, Ta, and W and the atomic ratios i, j, k, l, and Y respectively satisfy $0.20 \leq i \leq 0.85$, $0.05 \leq j \leq 0.50$, $0.01 \leq k \leq 0.45$, $0 \leq l \leq 0.10$, $i+j+k+l=1$, and $0 \leq Y \leq 0.6$, and has a thickness of 0.5 to 500 nm. Therefore, the layer A is a high hardness film having oxidation resistance and abrasion resistance, while the layer B is a film having high lubricity and low abrasion resistance along with a finer structure and having abrasion resistance, and on the other hand, alternately laminating the layer A, the layer B, and the nanolayer-alternating layer increases the hardness of the film and improves toughness, lubricity, and oxidation resistance, so that a tool with a longer life is achieved in terms of cutting work of various materials such as carbon steel, alloy steel, and heat-treated steel. Particularly, when the layer A contains an additive α composed of one or more elements selected from the group consisting of C, B, Si, V, Y, Zr, Nb, Mo, Hf, Ta, and W, crystal grains of the film can be made finer, and a diameter of the crystal grain of the film can be controlled by changing an added amount of the additive α. When the layer B contains an additive β composed of one or more elements selected from the group consisting of B, Si, V, Y, Zr, Nb, Mo, Hf, Ta, and W, crystal grains of the film can be made finer, and a diameter of the crystal grain of the film can be controlled by changing an added amount of the additive β. When the layer B contains carbon, the layer B has the structure containing not only nitride but also carbonitride, so that granular crystals can be made extremely fine, which significantly improves abrasion resistance and lubricity. In other words, since carbon is contained, a densified structure is formed. Moreover, in the layer C, the crystal grains of the film are made finer, the hard film is improved in hardness, toughness, heat resistance and lubricity, which improves abrasion resistance and welding resistance. Furthermore, in the nanolayer-alternating layer, the crystal grains of the film are made finer, which improves an internal stress relaxation effect produced by a nano multilayer structure in which the nanolayer A or the nanolayer B and the layer C are alternately laminated, so that a dispersing effect and a propagation suppressing effect on cracks are enhanced. As a result, the nanolayer-alternating layer is improved in film hardness, toughness, and abrasion resistance.

According to the hard film recited in the second aspect of the invention, since the value $T_A/T_{NL}$ of the ratio between the film thickness $T_A$ of the layer A and the film thickness $T_{NL}$ of the nanolayer-alternating layer is 0.2 to 10 while the value $T_B/T_{NL}$ of the ratio between the film thickness $T_B$ of the layer B and the film thickness $T_{NL}$ of the nanolayer-alternating layer is 0.2 to 10, the tool with a longer life is achieved in terms of cutting work of various materials such as carbon steel, alloy steel, and heat-treated steel.

According to the third aspect of the invention, since the hard film has the surface layer outside the hard film, and the surface layer is made of the same material as the layer A, the layer B, the layer C, or the nanolayer-alternating layer, the tool with a longer life is achieved in terms of cutting work of various materials such as carbon steel, alloy steel, and heat-treated steel due to the properties of the surface layer in addition to the hard film.

According to the fourth aspect of the invention, since the hard film is directly applied to the base material, the interface layer is no longer necessary between the hard film and the base material, which facilitates manufacturing.

According to the fifth aspect of the invention, the hard film is applied to the base material via the interface layer, and the interface layer is configured to have a thickness of 20 to 1000 nm and made of the same material as the layer A, the layer B, the layer C, or the nanolayer-alternating layer. Therefore, adhesiveness, i.e., adhesive strength, is further enhanced between the hard film and the base material. The sixth aspect of the invention provides the hard film-coated member partially or entirely coated with the hard film recited in any one of the first to fifth aspects of the invention. Therefore, the member with a longer life is achieved in terms of cutting work of various materials such as carbon steel, alloy steel, and heat-treated steel.

Preferably, the hard film-coated member is suitably applied to various hard film-coated working tools including rotary cutting tools such as end mills, drills, and milling cutters, non-rotary cutting tool such as tool bits, or non-cutting tools such as thread forming taps, rolling tools, and press dies. However, other than such working tools, the hard film-coated tool may be applied as various abrasion-resistant hard film-coated members required to have abrasion resistance and oxidation resistance such as bearing members.

The hard film of the present invention is preferably formed by a PVD method such as an arc ion plating method, an ion beam assisted deposition method, and a sputtering method, or other physical vapor deposition methods.

Although cemented carbide or high-speed tool steel is preferably used for the base material coated with the hard film of the present invention, various tool materials such as cermet, ceramics, polycrystalline diamond, and polycrystalline cBN are adoptable.

BRIEF DESCRIPTION OF DRAWINGS

FIG. 7 is a general diagram for explaining an arc ion plating apparatus that is an example of a physical vapor deposition apparatus forming the hard film of FIG. 1 on a tool base material.

FIG. 8 is a chart showing types and ratios of constituent elements of AlTiCr nitride constituting a layer A for each of test products 1 to 74 varied in types and ratios of constituent elements of layers A, B, and C constituting the hard film, types and composition ratios of additives of the constituent elements, and film thickness of the hard film.

FIG. 9 is a chart showing types and ratios of constituent elements of AlTiCr carbonitride or AlTiCr nitride constituting the layer B for each of the test products 1 to 74 of FIG. 8.

FIG. 10 is a chart showing types and ratios of constituent elements of AlCr(SiC) nitride or AlCr(SiC) carbonitride constituting the layer C for each of the test products 1 to 74 of FIG. 8.

FIG. 11 is a chart showing thicknesses of nanolayers A, B, and C, the number of laminated layer pairs of the nanolayers A and C or the nanolayers B and C, a thickness of a nanolayer-alternating layer, a thickness of an interface layer (intermediate layer), a thickness of the layer A, a thickness of the layer B, the number of laminated layer pairs of the layers A and B and the nanolayer-alternating layers, the total film thickness of the hard film, a thickness ratio of the layer A and the nanolayer-alternating layer, and a thickness ratio of the layer B and the nanolayer-alternating layer for each of the test products 1 to 74 of FIG. 8.

FIG. 12 is a chart showing film hardness, an oxide film thickness, a cutting distance, and a determination result for each of the test products 1 to 74 of FIG. 8.

MODES FOR CARRYING OUT THE INVENTION

An example of a hard film of the present invention will now be described in detail with reference to the drawings.

Example

Figure 1:
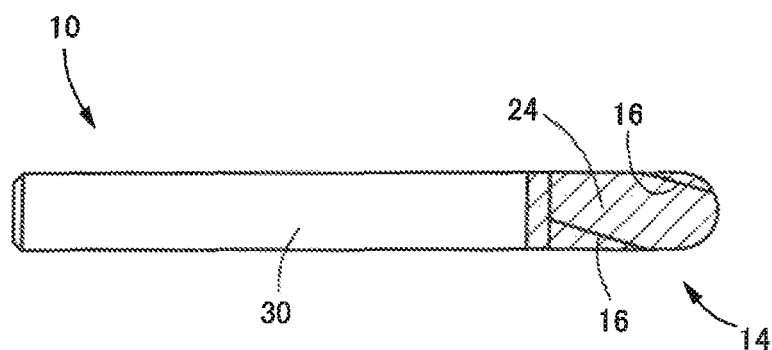
FIG. 1 is a front view showing an end mill coated with a hard film of an example of the present invention.
Figure 2:
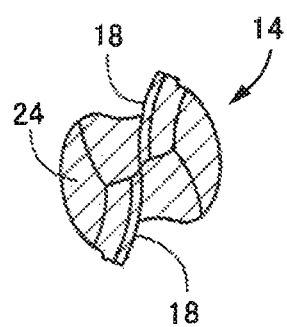
FIG. 2 is an enlarged bottom view showing the end mill of FIG. 1 as viewed from the tip side so as to explain a configuration of the end mill.

FIGS. 1 and 2 are views showing a ball end mill 10 (hereinafter referred to as an "end mill 10") that is an example of a hard film-coated tool or a hard film-coated member coated with a hard film 24 of the present invention. FIG. 1 is a front view of the end mill 10 in a direction orthogonal to an axial center thereof, FIG. 2 is an enlarged bottom view of a cutting portion 14 from the tip side (the right side of FIG. 1), and a tool base material 30 which is made of cemented carbide is integrally provided with the cutting portion 14 continuously from a shank. The cutting portion 14 has a pair of peripheral cutting edges 16 and ball end cutting edges 18 disposed as cutting edges symmetrically about the axial center and the hard film 24 applied to a surface of the cutting portion 14 and is rotationally driven around the axial center to perform cutting with the peripheral cutting edges 16 and the ball end cutting edges 18. Shaded areas of FIGS. 1 and 2 represent the hard film 24. In FIG. 1 and FIG. 2, the shaded areas show a coating portion of the hard film 24 as a hard film of the present invention. Although a portion of the end mill 10, i.e., the cutting portion 14, is coated with the hard film 24 in this example, the entire end mill 10 may be coated.

Figure 3:
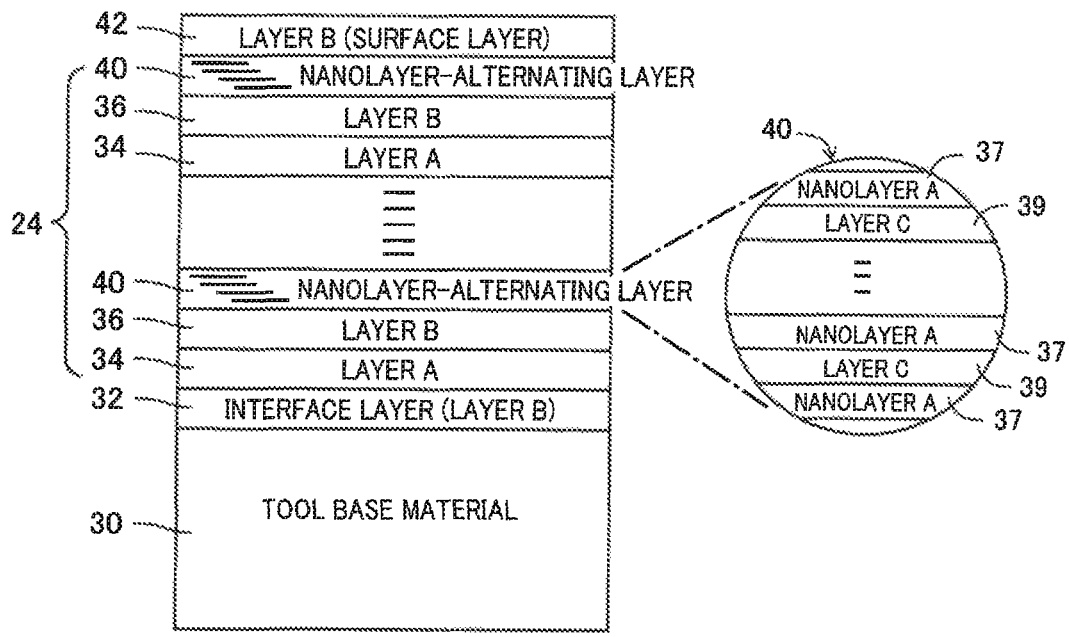
FIG. 3 is a schematic diagram for explaining an exemplary lamination structure of the hard film applied to the end mill of FIG. 1.

FIG. 3 is a schematic diagram for explaining a cross section of the hard film 24 of the end mill 10 in an enlarged manner. In FIG. 3, for example, the hard film 24 is laminated on the tool base material 30 made of cemented carbide via an interface layer (intermediate layer) 32 formed to a thickness of about 20 to 1000 nm by a physical vapor deposition method. This hard film 24 is configured to have a total film thickness of 0.5 to 20 μm by alternately laminating a layer A 34 formed to have a thickness of 0.5 to 1000 nm, a layer B 36 having a thickness of 0.5 to 1000 nm, and a nanolayer-alternating layer 40 as a multiple-layer area by a physical vapor deposition method. The nanolayer-alternating layer 40 is formed to a thickness of 1 to 1000 nm by alternately laminating a nanolayer A 37 or a nanolayer B 38 and a layer C 39 each having a thickness of 0.5 to 500 nm. The nanolayer A 37 and the nanolayer B 38 are made of the same materials (compositions) as the layer A 34 and the layer B 36, respectively.

The layer A 34 is made of an AlTiCr nitride having a composition formula of $(Al_aTi_bCr_c\alpha_d)N$, where α is one or more elements selected from the group consisting of C, B, Si, V, Y, Zr, Nb, Mo, Hf, Ta, and W and atomic ratios a, b, c, d respectively satisfy 0.10≤a≤0.85, 0.02≤b≤0.70, 0.03≤c≤0.65, 0≤d≤0.10, and a+b+c+d=1, and has a thickness of 0.5 to 1000 nm. When an additive α is contained at a proportion of 10% or less in the composition of $(Al_aTi_bCr_c\alpha_d)$ constituting the layer A 34, crystal grains can be made finer in the film of the layer A 34. By changing the proportion, in other words, the addition amount, of the additive α, a diameter of the crystal grain can be controlled. The compound constituting the layer A 34, i.e., the AlTiCr nitride including the additive α, has a cubic structure for a crystal system and is characterized by high hardness and excellent abrasion resistance. Additionally, the compound is excellent in lubricity, stability at high temperature, and oxidation resistance and is therefore characterized by improved strength at high temperature and improved toughness in high temperature and effective for reducing oxidation and wear due to heat generation during high-speed machining, achieving excellent lubricity and abrasion resistance favorably balanced with welding resistance. As a result, by disposing the layer A 34 on the tool, a longer life can be achieved even when the tool is used for high-speed machining and dry machining and subjected to heat generation during cutting.

The layer B 36 is made of an AlTiCr nitride or AlTiCr carbonitride having a composition formula of $(Al_eTi_fCr_g\beta_h)C_xN_{1-x}$, where β is one or more elements selected from the group consisting of B, Si, V, Y, Zr, Nb, Mo, Hf, Ta, and W and atomic ratios e, f, g, h, and X respectively satisfy 0.10≤e≤0.85, 0.02≤f≤0.70, 0.03≤g≤0.65, 0≤h≤0.10, e+f+g+h=1, and 0≤X≤0.6, and has a thickness of 0.5 to 1000 nm. When an additive β is contained at a proportion of 10% or less in the composition of $(Al_eTi_fCr_g\beta_h)$ constituting the layer B, crystal grains can be made finer in the film of the layer B 36, and by changing the proportion, in other words, the addition amount, of the additive β, a diameter of the crystal grain of the film can be controlled. When the layer B 36 contains the additive β and carbon, granular crystals can be made ultrafine, and abrasion resistance and lubricity are significantly improved. Since a dense structure containing carbon is formed in the layer B 36, high hardness and low friction properties can be improved. As a result, by disposing the layer B 36 on the tool, a longer life of the tool can be achieved in terms of high-speed machining and machining of a material difficult to process.

The nanolayer-alternating layer 40 is formed by alternately laminating the nanolayer A 37 and the layer C 39, or the nanolayer B 38 and the layer C 39, to a thickness of 1 to 1000 nm. The nanolayer A 37, the nanolayer B 38, and the layer C 39 each have a thickness of 0.5 to 500 nm. The nanolayer A 37 and the nanolayer B 38 are made of the same materials (compositions) as the layer A 34 and the layer B 36, respectively. By including the nanolayer-alternating layer 40 in the film 24, crystal grains of the film can be made finer in the nanolayer-alternating layer 40, and an internal stress relaxation effect of the nanolayer-alternating layer 40 can further be improved to enhance a dispersing effect and a propagation suppressing effect on cracks. Additionally, a nano multilayer structure provides improvements in film hardness, toughness, and abrasion resistance.

The layer C 39 is made of an AlCr(SiC) nitride or AlCr(SiC) carbonitride having a composition formula of $[Al_iCr_j(SiC)_k\gamma_l]C_YN_{1-Y}$, where γ is one or more elements selected from the group consisting of B, Ti, V, Y, Zr, Nb, Mo, Hf, Ta, and W and atomic ratios i, j, k, l, and Y respectively satisfy $0.20 \leq i \leq 0.85$, $0.05 \leq j \leq 0.50$, $0.01 \leq k \leq 0.45$, $0 \leq l \leq 0.10$, $i+j+k+l=1$, and $0 \leq Y \leq 0.6$, and has a thickness of 0.5 to 500 nm. When an additive γ is contained at a proportion of 10% or less in the composition of $[Al_iCr_j(SiC)_k\gamma_l]$ constituting the layer C, crystal grains can be made finer in the film of the layer C 39. Containing the additive γ provides improvements in hardness, toughness, heat resistance, and lubricity, which improves abrasion resistance and welding resistance. As a result, the life of the tool coated with the film 24 having the layer C 39 can be made longer in terms of high-speed machining and dry machining.

The interface layer 32 may be formed by the same physical vapor deposition method as the hard film 24 to a thickness of 20 to 1000 nm and made of the AlTiCr nitride constituting the layer A 34, the AlTiCr carbonitride or AlTiCr nitride constituting the layer B 36, the AlCr(SiC) carbonitride or AlCr(SiC) nitride constituting the layer C 39, or the material of the same nanolayer lamination structure as the nanolayer-alternating layer 40 (the AlTiCr carbonitride or AlTiCr nitride/the AlCr(SiC) nitride). In FIG. 3, for example, the interface layer 32 is made of the same material as the layer B 36, i.e., the AlTiCr carbonitride or AlTiCr nitride containing the additive β. In the nanolayer-alternating layer 40, the number of laminated layers of the nanolayer A 37 or the nanolayer B 38 and the layer C 39 may be an even number or may be an odd number of 3 or more, and the uppermost layer or the lowermost layer may be any of the nanolayer A 37 or the nanolayer B 38 and the layer C 39. In the hard film 24, the repeating number of laminated layers of the layer A 34, the layer B 36, and the nanolayer-alternating layer 40 may be an arbitrary number of 3 or more and is not limited to a multiple of 3. The uppermost layer or the lowermost layer of the hard film 24 may be any of the layer A 34, the layer B 36, and the nanolayer-alternating layer 40.

A surface layer 42 is a layer disposed outside the hard film 24, i.e., on the side opposite to the tool base material 30, and is formed by the same physical vapor deposition method as the hard film 24 to a thickness of 20 to 1000 nm. The surface layer 42 is made of the AlTiCr nitride constituting the layer A 34, the AlTiCr carbonitride or AlTiCr nitride constituting the layer B 36, the AlCr(SiC) carbonitride or AlCr(SiC) nitride constituting the layer C 39, or the material of the same nanolayer lamination structure as the nanolayer-alternating layer 40 (the AlTiCr carbonitride or AlTiCr nitride/ the AlCr(SiC) nitride). In FIG. 3, for example, the surface layer 42 is made of the same material as the layer B 36, i.e., the AlTiCr carbonitride or AlTiCr nitride containing the additive β.

Figure 4:
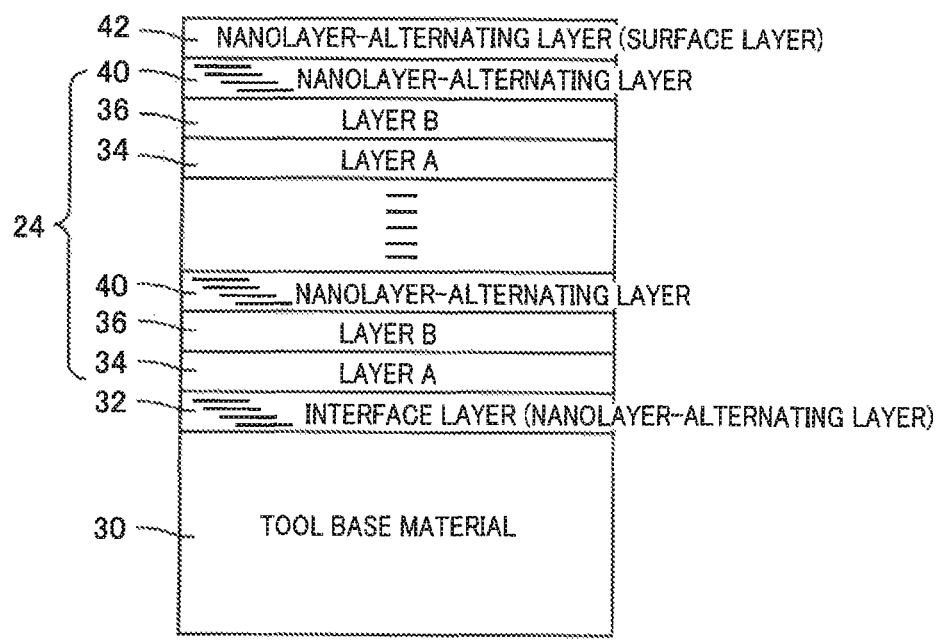
FIG. 4 is a schematic diagram for explaining another exemplary lamination structure of the hard film applied to the end mill of FIG. 1.
Figure 5:
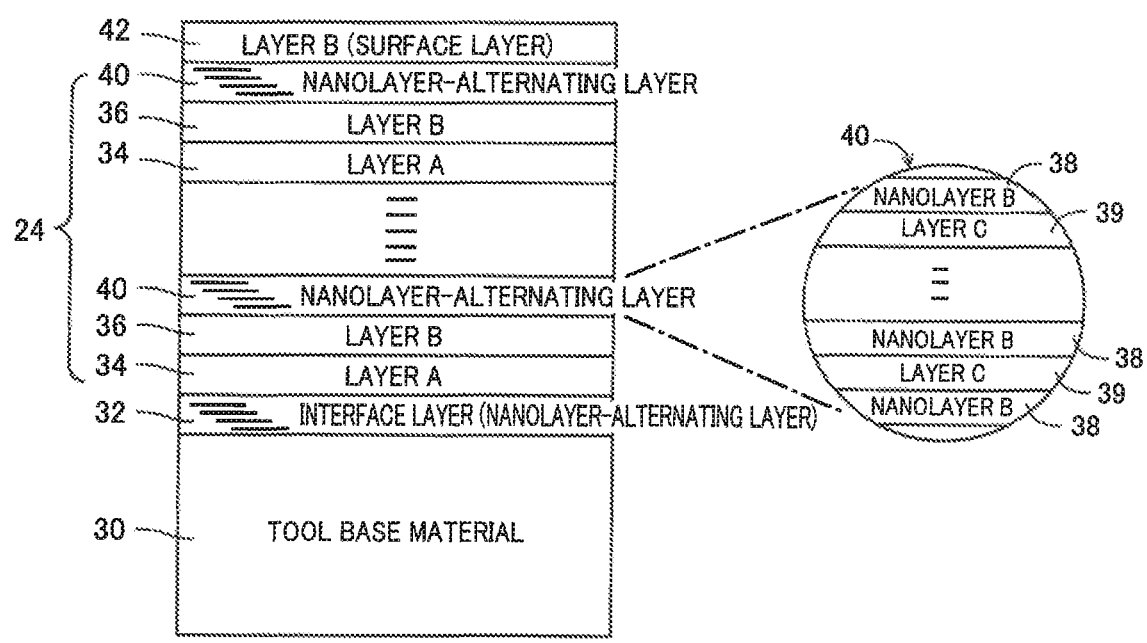
FIG. 5 is a schematic diagram for explaining still another exemplary lamination structure of the hard film applied to the end mill of FIG. 1.
Figure 6A:
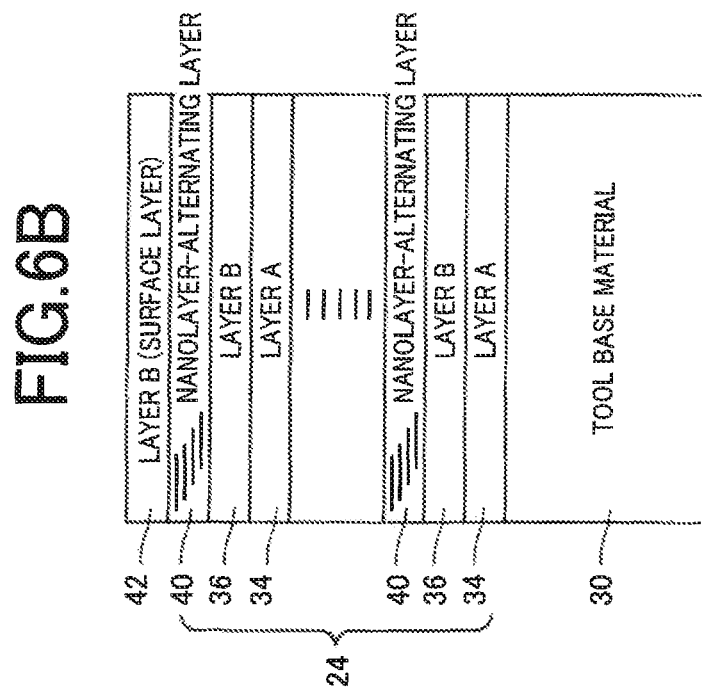
FIGS. 6A and 6B are schematic diagrams for explaining still another exemplary lamination structure of the hard film applied to the end mill of FIG. 1.
Figure 6B:
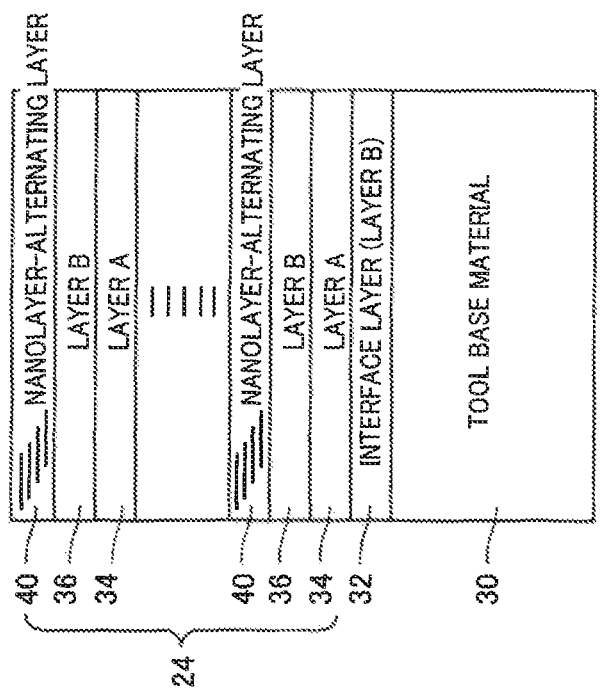

FIGS. 4, 5, and 6A and 6B respectively show other exemplary structures of the hard film 24. As compared to FIG. 3, the hard film 24 of FIG. 4 is different in that the surface layer 42 and the interface layer 32 are configured in the same way as the nanolayer-alternating layer 40 constituted by the nanolayer A 37 and the layer C 39. As compared to FIG. 3, the hard film 24 shown in FIG. 5 is different in that the nanolayer-alternating layer 40 is constituted by the nanolayer B 38 and the layer C 39 and that the interface layer 32 interposed between the tool base material 30 and the hard film 24 is configured in the same way as the nanolayer-alternating layer 40 constituted by the nanolayer B 38 and the layer C 39. The nanolayer-alternating layer 40 of FIG. 5 is formed the same as that of FIG. 3 except that the nanolayer B 38 is used instead of the nanolayer A 37 in the nanolayer-alternating layer 40. As compared to FIG. 3, the hard film 24 shown in FIG. 6A is different in that the surface layer 42 is not included, and the hard film 24 shown in FIG. 6B is different as compared to FIG. 3 in that the hard film 24 is directly laminated on the tool base material 30 without via the interface layer 32. Although not shown, the configuration without the surface layer 42 or the interface layer 32 is applicable not only to the hard film 24 of FIG. 3 but also to the hard film 24 shown in FIGS. 4, 5, etc., and a configuration without both the surface layer 42 and the interface layer 32 can also be implemented to produce a certain effect.

FIG. 7 is a general configuration diagram (schematic diagram) for explaining an arc ion plating apparatus 50 used for manufacturing the end mill 10. The arc ion plating apparatus 50 uses an arc ion plating method, which is a type of the physical vapor deposition method, to form the interface layer 32, the layer A 34 or the nanolayer A 37, the layer B 36 or the nanolayer B 38, the layer C 39, and the surface layer 42 on the tool base material 30 having the same shape as the end mill 10 shown in FIGS. 1 and 2.

For example, the arc ion plating apparatus 50 includes a rotating table 54 holding a plurality of workpieces, i.e., a plurality of the tool base materials 30 provided with the cutting portion 14 before being coated with the hard film 24 and rotationally driven around a rotation center which is substantially perpendicular to a plane of the rotating table 54, a bias power source 56 applying a negative bias voltage to the tool base materials 30, a chamber 58 serving as a process container housing the tool base materials 30 etc. inside, a heater 59 disposed in the chamber 58, a reactant gas supply apparatus 60 supplying a predetermined reactant gas into the chamber 58, an exhaust apparatus 62 discharging an air in the chamber 58 with a vacuum pump etc. to reduce pressure, a first arc power source 64, a second arc power source 66, a third arc power source 68, etc. The rotating table 54 has a cylindrical shape or a polygonal columnar shape around the rotation center and holds a plurality of the tool base materials 30 in an outer circumferential portion in a posture with tips of the tool base materials 30 protruding upward. The reactant gas supply device 60 includes a tank for storing an argon gas (Ar) and a tank for storing a nitrogen gas and supplies the nitrogen gas at the time of formation of the interface layer 32, the layer A 34 or the nanolayer A 37, the layer B 36 or the nanolayer B 38, the layer C 39, and the surface layer 42.

The first arc power source 64, the second arc power source 66, and the third arc power source 68 selectively applies a predetermined arc current between a first evaporation source 70, a second evaporation source 74, a third evaporation source 78 all made of vapor deposition materials as cathodes and anodes 72, 76, 80 respectively so as to cause arc discharge and thereby selectively evaporate evaporation materials from the first evaporation source 70, the second evaporation source 74, and the third evaporation source 78, and the evaporated evaporation material becomes positive ions and is allowed to coat the tool base materials 30 to which a negative (−) bias voltage is applied. Setting is made as to which one of the first arc power source 64, the second arc power source 66, and the third arc power source 68 is used, and the arc current and the bias voltage as well as film forming conditions including a temperature of 400 to 550° C. and a degree of vacuum of 2 to 10 Pa, such that predetermined compositions are evaporated to obtain the interface layer 32, the layer A 34 or the nanolayer A 37, the layer B 36 or the nanolayer B 38, the layer C 39, and the surface layer 42 respectively. The thicknesses of the interface layer 32, the layer A 34 or the nanolayer A 37, the layer B 36 or the nanolayer B 38, the layer C 39, and the surface layer 42 are adjusted by controlling a film formation time.

For example, the first evaporation source 70 is made of AlTiCr nitride having the composition formula of $(Al_aTi_bCr_c\alpha_d)N$ where the atomic ratios a, b, c, d respectively satisfying $0.10 \le a \le 0.85$, $0.02 \le b \le 0.70$, $0.03 \le c \le 0.65$, $0 \le d \le 0.10$, and $a+b+c+d=1$ and the additive $\alpha$ is one or more elements selected from the group consisting of C, B, Si, V, Y, Zr, Nb, Mo, Hf, Ta, and W accounting for 10 at % or less. The second evaporation source 74 is made of an AlTiCr carbonitride or AlTiCr nitride having the composition formula of $(Al_eTi_fCr_g\beta_h)C_xN_{1-X}$, where the atomic ratios e, f, g, h, and X respectively satisfy $0.10 \le e \le 0.85$, $0.02 \le f \le 0.70$, $0.03 \le g \le 0.65$, $0 \le h \le 0.10$, $e+f+g+h=1$, and $0 \le X \le 0.6$ and the additive $\beta$ is one or more elements selected from the group consisting of B, Si, V, Y, Zr, Nb, Mo, Hf, Ta, and W accounting for 10 at % or less. The third evaporation source 78 is made of an AlCr(SiC) carbonitride or AlCr(SiC) nitride having the composition formula of $[Al_iCr_j(SiC)_k\gamma_l]C_YN_{1-Y}$, where the atomic ratios i, j, k, l, and Y respectively satisfy $0.20 \le i \le 0.85$, $0.05 \le j \le 0.50$, $0.01 \le k \le 0.45$, $0 \le l \le 0.10$, $i+j+k+l=1$, and $0 \le Y \le 0.6$ and the additive $\gamma$ is one or more elements selected from the group consisting of B, Ti, V, Y, Zr, Nb, Mo, Hf, Ta, and W accounting for 10 at % or less. When the interface layer 32 is formed on the tool base material 30, a film formation material is evaporated from any one of the first evaporation source 70, the second evaporation source 74, and the third evaporation source 78 or a combination of these sources depending on the configuration of the interface layer 32. Specifically, when the layer A 34 is formed on the tool base material 30, the AlTiCr nitride containing the additive $\alpha$ is evaporated from the first evaporation source 70 by the first arc power source 64. When the layer B 36 is formed on the tool base material 30, AlTiCr carbonitride or nitride containing the additive $\beta$ is evaporated from the second evaporation source 74 by the second arc power source 66. When the nanolayer-alternating layer 40 is formed on the tool base material 30 and the nanolayer-alternating layer 40 is constituted by the nanolayer A 37 and the layer C 39, the nano-order nanolayer A 37 made of the AlTiCr nitride and the nano-layer-order layer C 39 made of the AlCr(SiC) carbonitride or AlCr(SiC) nitride are alternately laminated by alternately providing a section in which the AlTiCr nitride containing the additive $\alpha$ is evaporated from the first evaporation source 70 by the first arc power source 64 and a section in which the AlCr(SiC) carbonitride or AlCr(SiC) nitride is evaporated from the third evaporation source 78 by the third arc power source 68. When the nanolayer-alternating layer 40 is constituted by the nanolayer B 38 and the layer C 39, the nano-order nanolayer B 38 made of the AlTiCr carbonitride or AlTiCr nitride and the nano-layer-order layer C 39 made of the AlCr(SiC) carbonitride or AlCr(SiC) nitride are alternately laminated by alternately providing a section in which the AlTiCr carbonitride or AlTiCr nitride containing the additive $\beta$ is evaporated from the second evaporation source 74 by the second arc power source 66 and a section in which the AlCr(SiC) carbonitride or AlCr(SiC) nitride is evaporated from the third evaporation source 78 by the third arc power source 68. For the interface layer 32 and the surface layer 42, lamination is performed similar to forming each of the layer A 34, the layer B 36, and the nanolayer-alternating layer 40 depending on the configuration. As described above, for example, the hard film 24 shown in FIG. 3 is laminated on the tool base material 30.

To confirm abrasion resistance and welding resistance, the present inventor used the arc ion plating apparatus 50 of FIG. 7 to prepare 74 types of test products 1 to 74 provided with the hard film 24 shown in FIG. 6A formed on the tool base material 30 made of cemented carbide having the same shape as the end mill 10 shown in FIGS. 1 and 2 with the composition ratios (at %) and the film thicknesses (nm) of the layer A 34 and the nanolayer A 37, the layer B 36 and the nanolayer B 38, and the layer C 39, the number of laminated layer pairs of the layer B 36 and the layer C 39 in the nanolayer-alternating layer 40, the thickness of the nanolayer-alternating layer 40, the thicknesses (nm) of the layer A 34 and the layer B 36, the number of laminated layer pairs of the layer A 34 or the layer B 36 and the nanolayer-alternating layer 40, and the total film thickness (nm) of the hard film 24 made different as shown in FIGS. 8, 9, 10, and 11. The hardness of film of each of the test products 1 to 74 was measured in accordance with a film hardness (Vickers hardness) measurement method described below, the test products 1 to 74 were exposed to 1000° C. for one hour at an atmospheric pressure in an air atmosphere to measure thicknesses (μm) of generated oxide layers, and a cutting distance (m) was measured in accordance with a measurement method described below when each of the test products 1 to 74 was used for cutting in accordance with cutting test conditions described below to determine a cutting performance. FIG. 12 shows results of these evaluations. The units of composition values shown in FIGS. 8, 9, and 10 are at % (atomic %).

Film Hardness Measurement Method

In accordance with the Vickers hardness test method (JISG 0202, Z2244), HV values (Vickers hardness) of the hard films of test products 1 to 50 were measured under the conditions indicated by the hardness code HV 0.025.

Cutting Test Conditions

Work material: SKD11 (60HRC)
Cutting speed: 150.8 m/min (8000 min⁻¹)
Feeding speed: 0.1 mm/t (1600 mm/min)
Depth of cut: aa=0.2 mm, pf=0.4 mm
Cutting fluid: air blow Cutting Distance Measurement Method and Acceptability Determination Method)

The machining depth under the cutting test conditions and the tool life of the end mill, i.e., the cutting distance before a flank wear width reaches 0.1 mm, are shown in a cutting distance field of FIG. 12. A product not fully oxidized in the evaluation of the oxide layer thickness and having the cutting distance of 500 m or more is determined as being acceptable and indicated by a circle mark, and a product fully oxidized or having the cutting distance less than 500 m is determined as not being acceptable and indicated by a cross mark, in a determination field of FIG. 12.

As shown in FIG. 12, the film hardness of the test products 7 to 74 corresponding to the example products was 2890 to 3590 (HV0.025), providing the film hardness higher than the test products 1 to 6 corresponding to the comparative products.

As shown in FIG. 12, among the test products 1 to 6 corresponding to the comparative products, the test products 2, 3, 5, and 6 were determined as not being acceptable since the cutting distance before the wear width reaches 0.1 mm was less than the acceptability determination value of 500 m and the oxide layer thickness was evaluated as total oxidation, i.e., the hard film 24 was determined as being entirely oxidized. The test product 1 and the test product 4 were unable to be evaluated due to peeling-off of the film and therefore have the cross marks in the determination field. The test product 1 does not include the nanolayer-alternating layer 40 that is an alternating layer of the layer A 34 or the layer B 36 and the layer C 39 and is slightly short of satisfying the atomic ratio range defined in the present invention in terms of the compositions of the layer A 34, the layer B 36, and the layer C 39. The thickness of the interface layer (intermediate layer) 32 also falls below 20 nm, which is the lower limit of the range defined in the present invention, and the total film thickness exceeds 20 μm, which is the upper limit of the range defined in the present invention. In the test product 2, the thickness of the layer A 34 and the thickness of the layer B 36 each fall below 0.5 nm, and the thicknesses of the nanolayer B 38 and the layer C 39 constituting the nanolayer-alternating layer 40 also fall below 0.5 nm. The total film thickness falls below 0.5 μm. The thickness of the interface layer 32 falls below 20 nm, which is the lower limit of the range defined in the present invention. The test product 2 is slightly short of satisfying the atomic ratio range defined in the present invention in terms of the compositions of the layer A 34 and the nanolayer A 37, the layer B 36 and the nanolayer B 38, and the layer C 39. In the test product 3, the thickness of the layer A 34 and the thickness of the layer B 36 each exceed 1000 nm, and the thickness of the layer C 39 constituting the nanolayer-alternating layer 40 falls below the 0.5 nm. The total film thickness exceeds 20 μm. The thickness of the interface layer 32 exceeds 1000 nm, which is the upper limit of the range defined in the present invention. The test product 3 does not satisfy the atomic ratio range defined in the present invention in terms of the compositions of the layer A 34 and the nanolayer A 37, the layer B 36 and the nanolayer B 38, and the layer C 39. In the test product 4, the thickness of the nanolayer B 38 constituting the nanolayer-alternating layer 40 exceeds 500 nm, and the thickness of the nanolayer-alternating layer 40 also exceeds 1000 nm. The total film thickness exceeds 20 μm. The interface layer 32 exceeds 1000 nm, which is the upper limit of the range defined in the present invention. The test product 4 is slightly short of satisfying the atomic ratio range defined in the present invention in terms of the compositions of the layer A 34 and the nanolayer A 37, the layer B 36 and the nanolayer B 38, and the layer C 39. In the test product 5, the thickness of the layer A 34 and the thickness of the layer B 36 each fall below 0.5 nm. The thickness of the nanolayer B 38 constituting the nanolayer-alternating layer 40 also falls below 0.5 nm. The thickness of the interface layer 32 also falls below 20 nm. The test product 5 does not satisfy the atomic ratio range defined in the present invention in terms of the compositions of the layer A 34 and the nanolayer A 37, the layer B 36 and the nanolayer B 38, and the layer C 39. In the test product 6, the thickness of the layer A 34 exceeds 1000 nm, and the thickness of the nanolayer B 38 constituting the nanolayer-alternating layer 40 exceeds 500 nm, while the thickness of the layer C 39 falls below 0.5 nm. The thickness of the nanolayer-alternating layer 40 is greater than 1000 nm, and the total film thickness exceeds 20 μm. The test product 6 does not satisfy the atomic ratio range defined in the present invention in terms of the compositions of the layer A 34 and the nanolayer A 37, the layer B 36 and the nanolayer B 38, and the layer C 39.

However, the test products 7 to 74 corresponding to the example products were determined as being acceptable since the cutting distance before the wear width reaches 0.1 mm is the acceptability determination value of 500 m or more. The test products 7 to 74 were determined as being acceptable in both cases that the additive α in the layer A 34 and the nanolayer A 37 having the same composition as the layer A 34 was at least one selected from the group consisting of C, B, Si, V, Y, Zr, Nb, Mo, Hf, Ta, and W and that the additive α was not contained (the atomic ratio d of a was 0). Similarly, the test products 7 to 74 were determined as being acceptable in both cases that the additive β in the layer B 36 and the nanolayer B 38 having the same composition as the layer B 36 was selected from the group consisting of B, Si, V, Y, Zr, Nb, Mo, Hf, Ta, and W and that the additive β was not contained (the atomic ratio h of β was 0). The test products 7 to 74 were determined as being acceptable in both cases that the additive γ in the layer C 39 was at least one selected from the group consisting of B, Ti, V, Y, Zr, Nb, Mo, Hf, Ta, and W and that the additive γ was not contained (the atomic ratio 1 of γ was 0). The test products 7 to 74 were determined as being acceptable in both cases that the nanolayer-alternating layer 40 had the nanolayer A 37 and the layer C 39 alternately laminated and had the nanolayer B 38 and the layer 39 alternately laminated. The same results as in FIG. 12 were obtained from the end mills shown in FIGS. 3 to 5 having the surface layer 42 disposed outside the uppermost layer of the hard film 24, the end mill shown in FIG. 6B that has the same configuration except the absence of the interface layer 32, and an end mill in which the layer A 34, the layer B 36, and the nanolayer-alternating layer 40 constituting the hard film 24 are laminated in a different order, for example, the layer A 34, the nanolayer-alternating layer 40, and the layer B 36, in the form of FIG. 6A. In other words, the same results as in FIG. 12 were obtained regardless of the presence or absence of the surface layer 42, the presence or absence of the interface layer 32, whether the uppermost layer or the lowermost layer of the hard film 24 is the layer A 34 or the nanolayer-alternating layer 40, whether the number of laminated layers in the hard film 24 is even or odd, and the number of laminated layers of the nanolayer-alternating layer 40 was odd or even.

Regarding the composition ranges of the layer A 34 and the nanolayer A 37 in the test products 7 to 74 corresponding to the example products of FIGS. 8 to 12, Al is in the range of 10 to 85 at % as indicated by, for example, the test products 8, 9, 27, 37, 47, 73 and the test products 7, 38, 53, 59 of FIG. 8 showing the lower limit and the upper limit, respectively; Ti is in the range of 2 to 70 at % as indicated by the test products 7, 12, 53 and the test products 8, 26, 47 of FIG. 8 showing the lower limit and the upper limit, respectively; Cr is in the range of 3 to 65 at % as indicated by the test products 33, 53 and the test products 9, 73 of FIG. 8 showing the lower limit and the upper limit, respectively; and the additive a is at least one element of C, B, Si, V, Y, Zr, Nb, Mo, Hf, Ta, and W and is in the range of 0 to 10 at % as indicated by the test products 7 to 11, 16 to 19, 28 to 37 and the test products 39, 53, 71 of FIG. 8 showing the lower limit and the upper limit, respectively. Therefore, the preferred composition of the layer A 34 is the AlTiCr nitride having the composition formula of $(Al_aTi_bCr_c\alpha_d)N$, where the atomic ratios a, b, c, d respectively satisfy $0.10 \leq a \leq 0.85$, $0.02 \leq b \leq 0.70$, $0.03 \leq c \leq 0.65$, $0 \leq d \leq 0.10$, and $a+b+c+d=1$. A preferable range of a film thickness $T_A$ of the layer A 34 is 0.5 to 1000 nm as indicated by, for example, the test products 7, 55 and the test products 10, 41, 59 of FIG. 11 showing the lower limit and the upper limit, respectively.

Regarding the composition ranges of the layer B 36 and the nanolayer B 38 in the test products 7 to 74 corresponding to the example products of FIGS. 8 to 12, Al is in the range of 10 to 85 at % as indicated by, for example, the test products 9, 16, 43, 44, 51 and the test products 7, 8, 47, 67 of FIG. 9 showing the lower limit and the upper limit, respectively; Ti is in the range of 2 to 70 at % as indicated by the test products 7, 17, 26, 38, 52 and the test products 9, 16, 27, 41, 51 of FIG. 9 showing the lower limit and the upper limit, respectively; Cr is in the range of 3 to 65 at % as indicated by the test products 32, 41, 67 and the test products 38, 52, 57, 71 of FIG. 9 showing the lower limit and the upper limit, respectively; and the additive β is at least one element of B, Si, V, Y, Zr, Nb, Mo, Hf, Ta, and W and is in the range of 0 to 10 at % as indicated by the test products 7 to 19, 24 to 27 and the test products 31, 38, 57 of FIG. 9 showing the lower limit and the upper limit, respectively. In the ratio between carbon and nitrogen in the carbonitride, carbon is in the range of 0 to 60 at % as indicated by the test products 7-9, 12, 13, 16, 17, 20, 21, 24, 25, 28-31, 34-35 and the test products 44, 66 of FIG. 9 showing the lower limit and the upper limit, respectively. Therefore, the preferred composition of the layer B 36 is the AlTiCr carbonitride or AlTiCr nitride having the composition formula of $(Al_eTi_fCr_g\beta_h)C_xN_{1-X}$, where the atomic ratios e, f, g, h, and X respectively satisfy $0.10 \leq e \leq 0.85$, $0.02 \leq f \leq 0.70$, $0.03 \leq g \leq 0.65$, $0 \leq h \leq 0.10$, $e+f+g+h=1$, and $0 \leq X \leq 0.6$. A preferable range of a film thickness $T_B$ of the layer B 36 is 0.5 to 1000 nm as indicated by, for example, the test products 7, 55 and the test products 35, 59 of FIG. 11 showing the lower limit and the upper limit, respectively.

Regarding the composition ranges of the layer C 39 in the test products 7 to 74 corresponding to the example products of FIGS. 8 to 12, Al is in the range of 20 to 85 at % as indicated by, for example, the test products 8, 34 and the test products 7, 16, 58 of FIG. 10 showing the lower limit and the upper limit, respectively; Cr is in the range of 5 to 50 at % as indicated by the test products 7, 12, 16, 54, 57, 58 and the test products 8, 9, 13, 21 to 22, 30, 31, 34, 40, 48, 68 of FIG. 10 showing the lower limit and the upper limit, respectively; SiC is in the range of 1 to 45 at % as indicated by the test products 50, 62 and the test products 26, 54, 66 of FIG. 10 showing the lower limit and the upper limit, respectively; and the additive γ is at least one element of B, Ti, V, Y, Zr, Nb, Mo, Hf, Ta, and W and is in the range of 0 to 10 at % as indicated by the test products 7 to 15, 20 to 23, 30 to 33 and the test products 34, 38, 48, 68 of FIG. 10 showing the lower limit and the upper limit, respectively. In the ratio between carbon and nitrogen in the carbonitride, carbon is in the range of 0 to 60 at % as indicated by the test products 7, 8, 11 to 13, 16 to 18, 20, 21, 24, 25, 28 to 35, 38 to 56 and the test products 36, 61, 66 showing the lower limit and the upper limit, respectively. Therefore, the preferred composition of the layer C 39 is the AlCr(SiC) nitride or AlCr(SiC) carbonitride having the composition formula of $[Al_iCr_j(SiC)_k\gamma_l]C_YN_{1-Y}$, where the atomic ratios i, j, k, l, and Y respectively satisfy $0.20 \leq i \leq 0.85$, $0.05 \leq j \leq 0.50$, $0.01 \leq k \leq 0.45$, $0 \leq l \leq 0.10$, $i+j+k+l=1$, and $0 \leq Y \leq 0.6$. A preferable range of a film thickness $T_C$ of the layer C 39 is 0.5 to 500 nm as indicated by, for example, the test products 7, 12, 21, 73 and the test product 44 of FIG. 11 showing the lower limit and the upper limit, respectively.

In the test products 7 to 74 corresponding to the example products of FIGS. 8 to 12, the thickness range of the nanolayer-alternating layer 40 is 1 to 1000 nm as indicated by, for example, the test product 7 and the test products 17, 33, 68 of FIG. 11 showing the lower limit and the upper limit, respectively. A value $T_A/T_{NL}$ of the ratio between the film thickness $T_A$ of the layer A 34 and a film thickness $T_{NL}$ of the nanolayer-alternating layer 40 and a value $T_B/T_{NL}$ of the ratio between the film thickness $T_B$ of the layer B 36 and the film thickness $T_{NL}$ of the nanolayer-alternating layer 40 are in the range of 0.2 to 10 as indicated by, for example, the test products 8, 47 and the test product 73 of FIG. 11 showing the lower limit and the upper limit, respectively.

In the test products 7 to 74 corresponding to the example products of FIG. 12, the thickness range of the interface layer (intermediate layer) 32 is 20 to 1000 nm as indicated by, for example, the test products 7, 44, 67, 69 and the test products 16, 33, 51, 60, 68 of FIG. 11 showing the lower limit and the upper limit, respectively.

In the test products 7 to 74 corresponding to the example products of FIG. 12, the range of the total film thickness of the hard film 24 is 0.5 to 20 μm as indicated by, for example, the test product 7 and the test products 50, 59 of FIG. 11 showing the lower limit and the upper limit, respectively.

In the test products 7 to 74 corresponding to the example products of FIGS. 8 to 12, the number of repetitions of lamination of one nanolayer A 37 or one nanolayer B 38 and one layer C 39 in the nanolayer-alternating layer 40, i.e., the number of pairs of the nanolayer A 37 or the nanolayer B 38 and the layer C 39, is 1 to 125 as indicated by, for example, the test products 7, 15, 20, 28, 43, 44, 48, 65 and the test product 33 showing the lower limit and the upper limit, respectively. The number of repetitions of lamination of one layer A 34, one layer B 36, and one nanolayer-alternating layer 40 in the hard film 24, i.e., the number of pairs (the number of sets) of the layer A 34 and the nanolayer-alternating layer 40, is 1 to 1500 as indicated by, for example, the test products 19, 25 and the test product 56 showing the lower limit and the upper limit, respectively.

Figure 13:
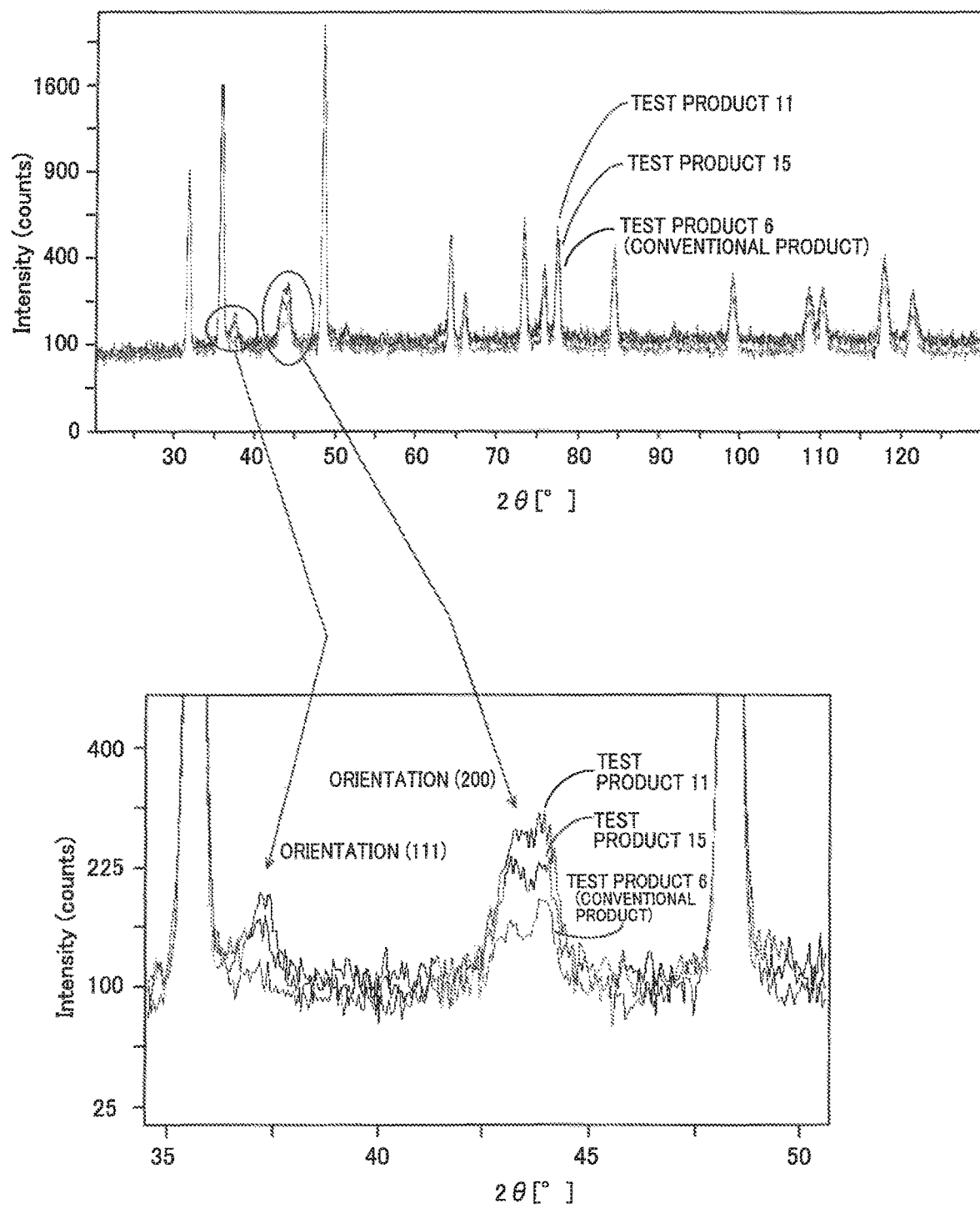
FIG. 13 is a diagram showing diffraction lines obtained by X-ray diffraction using a θ-2θ method for the test products 6, 11, 15 among the test products 1 to 74 of FIG. 8.

FIG. 13 shows measurement results of X-ray diffraction of the hard film 24 performed with a θ-2θ method by using an X-ray diffraction apparatus (XRD) for the test product 6 corresponding to the comparative product and the test products 11, 15 corresponding to the example products among the test products 1 to 74 shown in FIGS. 8 to 12. The horizontal axis and the vertical axis represent an angle 2θ(°) and intensity, respectively. As shown in FIG. 13, an integral intensity of a diffraction line at an angle corresponding to the (200) plane of TiN is twice or more as large as an integral intensity at an angle corresponding to the (111) plane, and an integral intensity of a diffraction line at an angle corresponding to the (200) plane of CrN is twice or more as large as an integral intensity at an angle corresponding to the (111) plane.

According to the example, the hard film 24 for coating a surface of the tool base material 30 is configured to have a film thickness of 0.5 to 20 μm by using a physical vapor deposition method to alternately laminate the layer A 34, the layer B 36, and the nanolayer-alternating layer 40 in which the nanolayer A 37 or the nanolayer B 38 and the layer C 39 are alternately laminated to a nano-order thickness; the layer A 34 is the AlTiCr nitride having the composition formula of $(Al_aTi_bCr_c\alpha_d)N$, where α is one or more elements selected from the group consisting of C, B, Si, V, Y, Zr, Nb, Mo, Hf, Ta, and W and the atomic ratios a, b, c, d respectively satisfy 0.10≤a≤0.85, 0.02≤b≤0.70, 0.03≤c≤0.65, 0≤d≤0.10, and a+b+c+d=1, and has a thickness of 0.5 to 1000 nm; the layer B 36 is an AlTiCr nitride or AlTiCr carbonitride having the composition formula of $(Al_eTi_fCr_g\beta_h)C_xN_{1-X}$, where β is one or more elements selected from the group consisting of B, Si, V, Y, Zr, Nb, Mo, Hf, Ta, and W and the atomic ratios e, f, g, h, and X respectively satisfy 0.10≤e≤0.85, 0.02≤f≤0.70, 0.03≤g≤0.65, 0≤h≤0.10, e+f+g+h=1, and 0≤X≤0.6, and has a thickness of 0.5 to 1000 nm; the nanolayer-alternating layer 40 is formed by alternately laminating the nanolayer A 37 having the same composition as the layer A 34 or the nanolayer B 38 having the same composition as the layer B 36 and the layer C 39 and has a thickness of 1 to 1000 nm; the nanolayer A 37 and the nanolayer B 38 each have a thickness of 0.5 to 500 nm; the layer C 39 is the AlCr(SiC) nitride or AlCr(SiC) carbonitride having the composition formula of $[Al_iCr_j(SiC)_k\gamma_l]C_yN_{1-y}$, where γ is one or more elements selected from the group consisting of B, Ti, V, Y, Zr, Nb, Mo, Hf, Ta, and W and the atomic ratios i, j, k, l, and Y respectively satisfy 0.20≤i≤0.85, 0.05≤j≤0.50, 0.01≤k≤0.45, 0≤l≤0.10, i+j+k+l=1, and 0≤Y≤0.6, and has a thickness of 0.5 to 500 nm; and therefore, the abrasion resistance, toughness, and welding resistance of the hard film 24 are improved in cutting of carbon steel, alloy steel, heat-treated steel, etc., so that the life of the end mill 10 is made longer.

According to the example, since the value $T_A/T_{NL}$ of the ratio between the film thickness $T_A$ of the layer A 34 and the film thickness $T_{NL}$ of the nanolayer-alternating layer 40 is 0.2 to 10 while the value $T_B/T_{NL}$ of the ratio between the film thickness $T_B$ of the layer B 36 and the film thickness $T_{NL}$ of the nanolayer-alternating layer 40 is 0.2 to 10, the tool with a longer life is achieved in terms of cutting work of various materials such as carbon steel, alloy steel, and heat-treated steel.

According to the example, since the hard film 24 shown in FIGS. 3, 4, 5, and 6B has the surface layer 42 outside the hard film 24, and the surface layer 42 is made of the same material as the layer A 34, the layer B 36, the layer C 39, or the nanolayer-alternating layer 40, the tool 10 with a longer life is achieved in terms of cutting work of various materials such as carbon steel, alloy steel, and heat-treated steel due to the properties of the surface layer 42 in addition to the hard film 24.

According to the example, since the hard film 24 shown in FIG. 6B is directly applied to the tool base material 30, the interface layer is no longer necessary between the hard film 24 and the tool base material 30, which facilitates manufacturing.

According to the example, the hard film 24 shown in FIGS. 3, 4, 5, and 6A is applied to the tool base material 30 via the interface layer 32, and the interface layer 32 is formed to a thickness of 20 to 1000 nm from the same material as the layer A 34, the layer B 36, or the nanolayer-alternating layer 40. Therefore, adhesiveness, i.e., adhesive strength, is further enhanced between the hard film 24 and the tool base material 30.

Since the end mill 10 of the example is a hard film-coated tool partially coated with the hard film 24, abrasion resistance is achieved for cutting of carbon steel, alloy steel, etc., and welding resistance is achieved for cutting of heat-treated steel etc.

Although the examples of the present invention have been described in detail with reference to the drawings, these are merely an embodiment, and the present invention can be implemented in variously modified and improved forms based on the knowledge of those skilled in the art.

REFERENCE SIGNS LIST

10: end mill (hard film-coated member)
24: hard film
30: tool base material (base material)
34: layer A
36: layer B
37: nanolayer A
38: nanolayer B
39: layer C
40: nanolayer-alternating layer

The invention claimed is:

1. A hard film for coating a surface of a base material, the hard film configured to include a layer A, a layer B, and a nanolayer-alternating layer alternately laminated by a physical vapor deposition method to a total film thickness of 0.5 to 20 μm, wherein the layer A is an AlTiCr nitride having a composition formula of $(Al_aTi_bCr_c\alpha_d)N$, where α is one or more elements selected from a group consisting of C, B, Si, V, Y, Zr, Nb, Mo, Hf, Ta, and W and atomic ratios a, b, c, d respectively satisfy 0.10≤a≤0.85, 0.02≤b≤0.70, 0.03≤c≤0.65, 0≤d≤0.10, and a+b+c+d=1, and has a thickness of 0.5 to 1000 nm, wherein the layer B is an AlTiCr carbonitride having a composition formula of $(Al_eTi_fCr_g\beta_h)C_xN_{1-X}$, where β is one or more elements selected from a group consisting of B, Si, V, Y, Zr, Nb, Mo, Hf, Ta, and W and atomic ratios e, f, g, h, and X respectively satisfy 0.10≤e≤0.85, 0.02≤f≤0.70, 0.03≤g≤0.65, 0≤h≤0.10, e+f+g+h=1, and 0≤X≤0.6, and has a thickness of 0.5 to 1000 nm, wherein the nanolayer-alternating layer is formed by alternately laminating a nanolayer A or a nanolayer B having the same composition as the layer A or the layer B and a layer C and has a thickness of 1 to 1000 nm, wherein the nanolayer A and the nanolayer B each have a thickness of 0.5 to 500 nm, and wherein the layer C is an AlCr(SiC) nitride or AlCr(SiC) carbonitride having a composition formula of $[Al_iCr_j(SiC)_k\gamma_l]C_YN_{1-Y}$, where $\gamma$ is one or more elements selected from a group consisting of B, Ti, V, Y, Zr, Nb, Mo, Hf, Ta, and W and atomic ratios i, j, k, l, and Y respectively satisfy $0.20 \le i \le 0.85$, $0.05 \le j \le 0.50$, $0.01 \le k \le 0.45$, $0 \le l \le 0.10$, $i+j+k+l=1$, and $0 \le Y \le 0.6$, and has a thickness of 0.5 to 500 nm.

2. The hard film according to claim 1, wherein
a value $T_A/T_{NL}$ of a ratio between a film thickness $T_A$ of the layer A and a film thickness $T_{NL}$ of the nanolayer-alternating layer is 0.2 to 10 while a value $T_B/T_{NL}$ of a ratio between a film thickness $T_B$ of the layer B and the film thickness $T_{NL}$ of the nanolayer-alternating layer is 0.2 to 10.

3. The hard film according to claim 1, further including
a surface layer outside the hard film, wherein
the surface layer is made of the same material as the layer A, the layer B, the layer C, or the nanolayer-alternating layer.

4. The hard film according to claim 1, wherein
the hard film is directly applied to the base material.

5. The hard film according to claim 1, wherein
the hard film is applied to the base material via an interface layer, and wherein
the interface layer is configured to have a thickness of 20 to 1000 nm and made of the same material as the layer A, the layer B, the layer C, or the nanolayer-alternating layer.

6. A hard film-coated member partially or entirely coated with the hard film according to claim 1.

\* \* \* \* \*